US007676280B1

(12) United States Patent
Bash et al.

(10) Patent No.: US 7,676,280 B1
(45) Date of Patent: Mar. 9, 2010

(54) DYNAMIC ENVIRONMENTAL MANAGEMENT

(75) Inventors: Cullen E. Bash, Los Gatos, CA (US); Carlos J. Felix, Sol y Mar, PR (US); William J. Navas, Mayaguez, PR (US); Maniel Sotomayor, Vega Baja, PR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 281 days.

(21) Appl. No.: 11/796,943

(22) Filed: Apr. 30, 2007

Related U.S. Application Data

(63) Continuation-in-part of application No. 11/699,402, filed on Jan. 29, 2007.

(51) Int. Cl.
*G05B 11/01* (2006.01)

(52) U.S. Cl. ..................................................... 700/17
(58) Field of Classification Search ................ 700/1–3, 700/9, 17, 276–278, 299, 300
See application file for complete search history.

(56) References Cited

U.S. PATENT DOCUMENTS

| | | | |
|---|---|---|---|
| 6,283,380 B1 | 9/2001 | Nakanishi et al. | |
| 6,374,627 B1 * | 4/2002 | Schumacher et al. | 62/259.2 |
| 6,574,104 B2 | 6/2003 | Patel et al. | |
| 6,697,707 B2 | 2/2004 | Peters, II | |
| 6,854,659 B2 | 2/2005 | Stahl et al. | |
| 6,868,682 B2 * | 3/2005 | Sharma et al. | 62/180 |
| 6,945,058 B2 * | 9/2005 | Bash et al. | 62/89 |
| 6,957,544 B2 | 10/2005 | Dobbs et al. | |
| 7,020,586 B2 * | 3/2006 | Snevely | 703/1 |
| 7,117,129 B1 * | 10/2006 | Bash et al. | 702/194 |
| 7,251,547 B2 * | 7/2007 | Bash et al. | 700/276 |
| 7,275,380 B2 | 10/2007 | Durant et al. | |
| 2003/0193777 A1 | 10/2003 | Friedrich et al. | |
| 2003/0221821 A1 | 12/2003 | Patel et al. | |
| 2004/0141542 A1 | 7/2004 | Sharma et al. | |
| 2005/0182523 A1 | 8/2005 | Nair | |
| 2005/0241325 A1 | 11/2005 | Olney | |
| 2005/0257537 A1 | 11/2005 | Chang et al. | |
| 2005/0257539 A1 | 11/2005 | Lee et al. | |
| 2006/0075764 A1 | 4/2006 | Bash et al. | |
| 2006/0080001 A1 | 4/2006 | Bash et al. | |

(Continued)

FOREIGN PATENT DOCUMENTS

JP     2000241002 A     9/2000

OTHER PUBLICATIONS

Patel et al. - "Smart chip, system and data center enabled by advanced flexible cooling resources"- IEEE 21st Semi-Annual Symposium - Mar. 2005.

(Continued)

*Primary Examiner*—M. N. von Buhr

(57) ABSTRACT

A system is described herein for providing environmental management of a physical location using a sensor network having a plurality of environmental sensors and at least one primary actuator configured to provide an environmental change to the physical location. The system includes a communications module that operates to access the plurality of environmental sensors of the sensor network, and an application module that operates to: a) commission the plurality of environmental sensors of the sensor network; control an operation of the at least one primary actuator to provide environmental management of the physical location based on the commission of the plurality of environmental sensors of the sensor network; and c) provide a graphical layout of an environmental condition of the physical location based on both the commission of the plurality of environmental sensors and the control of the at least one primary actuator.

20 Claims, 20 Drawing Sheets

U.S. PATENT DOCUMENTS

| | | | |
|---|---|---|---|
| 2006/0214014 A1* | 9/2006 | Bash et al. | 236/1 B |
| 2006/0277501 A1* | 12/2006 | Plocher et al. | 715/853 |
| 2007/0100494 A1 | 5/2007 | Patel et al. | |
| 2007/0132756 A1* | 6/2007 | Plocher et al. | 345/420 |
| 2008/0120335 A1* | 5/2008 | Dolgoff | 707/104.1 |
| 2008/0217419 A1* | 9/2008 | Ehlers et al. | 236/44 |
| 2008/0244104 A1* | 10/2008 | Clemente | 710/11 |
| 2008/0281472 A1* | 11/2008 | Podgorny et al. | 700/276 |

OTHER PUBLICATIONS

Patel C D et al - "Computational Fluid Dynamics Modeling of High Compute Density Data Centers to Assure System Inlet Air Specifications"- Proceedings of IPACK '01 (The Pacific Rim/ASME International Electronics Packing Technical Conference and Exhibition) - Jul. 2001.

* cited by examiner

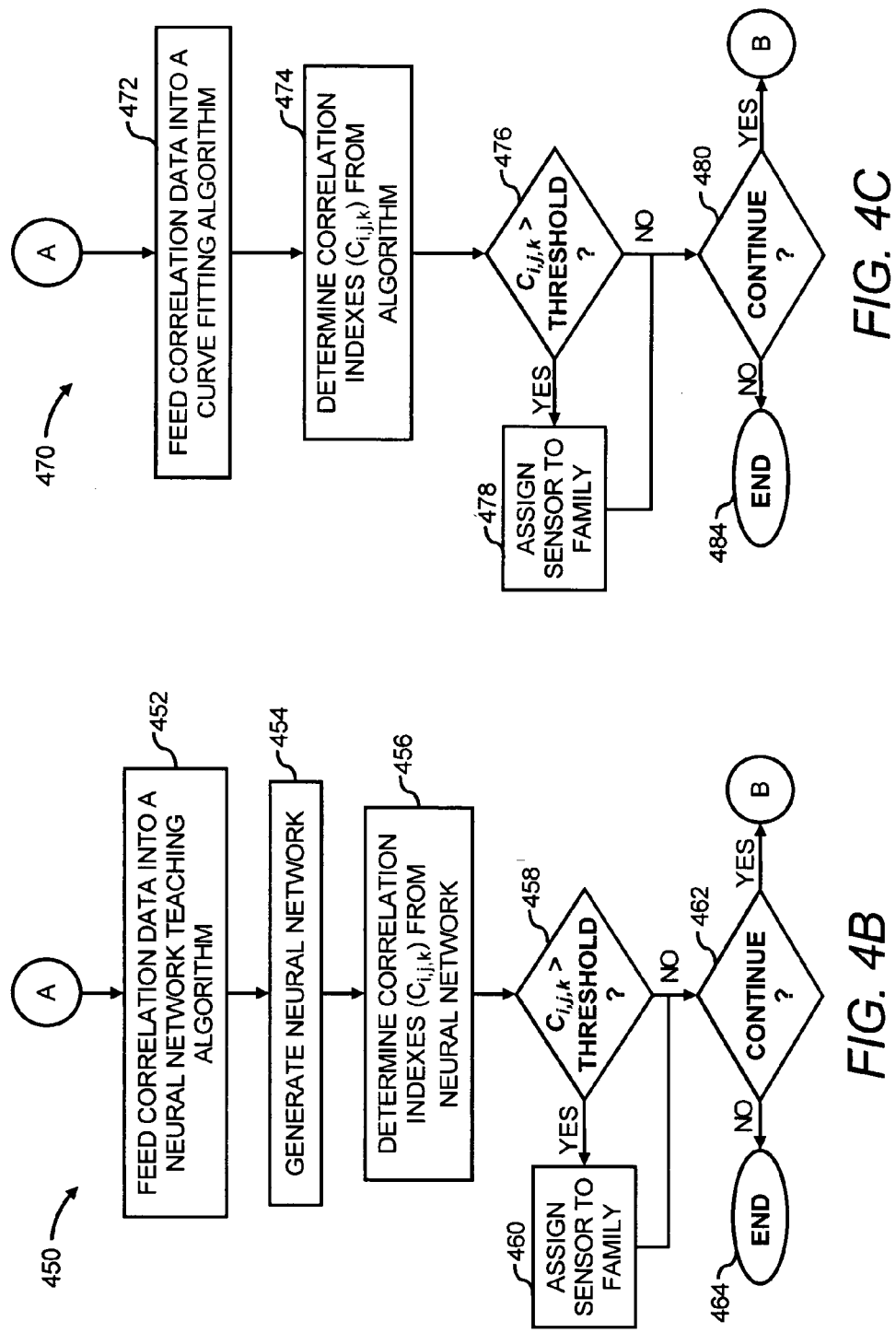

DYNAMIC ENVIRONMENTAL MANAGEMENT

PRIORITY

This application is a continuation-in-part of the following U.S. patent Application Publication and patent Applications: U.S. Patent Application Publication No. 20060206291, entitled "COMMISIONING OF SENSORS," filed on Mar. 11, 2005 and published on Sep. 14, 2006, now U.S. Pat. No. 7,117,129; U.S. Patent Application Publication No. 20060214014, entitled "TEMPERATURE CONTROL USING A SENSOR NETWORK," filed on Mar. 25, 2005 and published on Sep. 28, 2006; and U.S. patent application Ser. No. 11/699,402, entitled "COMPUTERIZED TOOL FOR ASSESSIGN CONDITIONS IN A ROOM," filed on Jan. 29, 2007; all of which are herein incorporated by reference in their entireties.

BACKGROUND

A data center may be defined as a physical location, for example, a room that houses one or more components, such as computer systems, that are capable of generating heat. The computer systems may be arranged in a number of racks. These racks are configured to house a number of computer systems which typically include a number of printed circuit boards (PCBs), mass storage devices, power supplies, processors, micro-controllers, and semi-conductor devices, that dissipate relatively significant amounts of heat during their operation.

Increases in system-level compaction of data centers have resulted in increases of server-level and rack-level power densities and dissipations that place significant pressure on traditional data center thermal management systems. Conventional data center thermal management involves traditional systems that use computer room air conditioning (CRAC) units to pressurize a raised floor plenum of a data center with cool air that is passed to equipment racks via ventilation tiles distributed throughout the raised floor. Temperature is typically monitored and controlled based on a single sensory feedback signal, which acts as a global indication of the heat being dissipated in the data center, at the hot air return of the CRAC units away from the equipment racks. This conventional mode of operation allows no local flexibility in how the cooling is delivered to the servers or computers in the data center, and there is no local state feedback information from different areas of the data center. Consequently, due primarily to a lack of distributed environmental sensing, traditional thermal management systems often operate conservatively with reduced computational density, added operational expense, and unnecessary redundancy due to poor utilization.

BRIEF DESCRIPTION OF THE DRAWINGS

Embodiments are illustrated by way of example and not limited in the following figure(s), in which like numerals indicate like elements, in which:

FIG. 4B illustrates a flow diagram of an operational mode for assigning sensors to respective actuator families based upon a neural network, according to an embodiment of the invention;

FIG. 4C illustrates a flow diagram of an operational mode for assigning sensors to respective actuator families based upon a curve fitting algorithm, according to an embodiment of the invention;

DETAILED DESCRIPTION

Figure 1A:
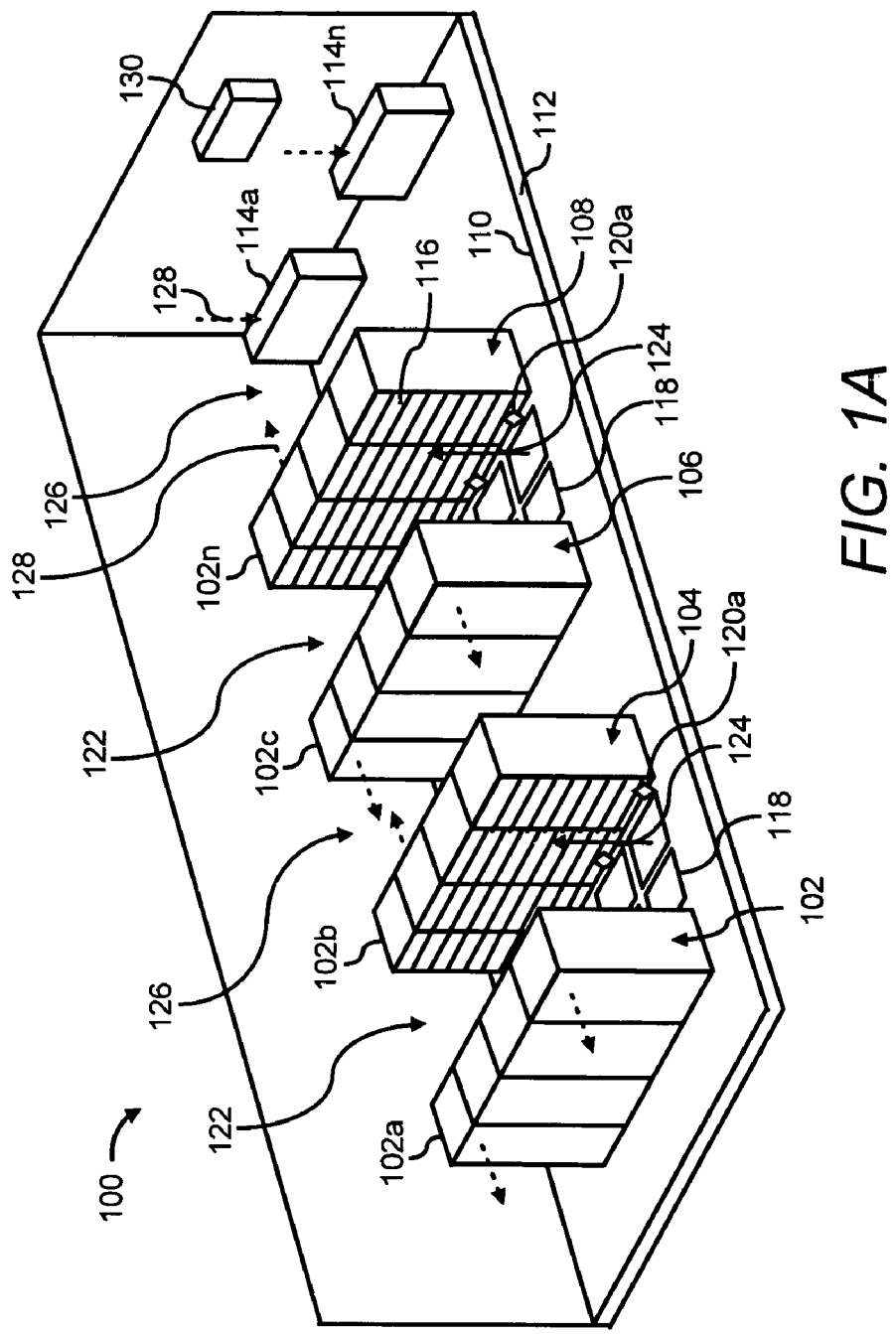
FIG. 1A shows a simplified perspective view of a data center, according to an embodiment of the invention.

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures have not been described in detail so as not to unnecessarily obscure the embodiments.

Described herein are systems and methods for an environmental management (EM) architecture for a physical setting or environment, such as a data center. The EM architecture includes a set of one or more management software programs or modules operable to interact with a distributed sensor network and actuators in the data center, to exert control over the actuators based on sensor measurements obtained from the distributed sensor network, and to provide analysis and visualization of thermal profiles in the data center.

In one embodiment, the actuators may be controlled according to a control scheme designed to enable efficient energy utilization by the data center while satisfying one or more user-defined criteria (e.g., thermal management criteria) for environmental management of the data center. An example of a control scheme is disclosed in a co-pending and commonly assigned U.S. patent application as identified from its U.S. Patent Application Publication No. 20060214014, entitled "TEMPERATURE CONTROL USING A SENSOR NETWORK." Additionally, the control scheme for the actuators may be based on correlations developed between the actuators and the sensors of the distributed sensor network. The correlations may be developed through a process for commissioning the sensors with respect to the actuators. In addition, the correlations generally provide indications of how the sensors of the sensor network may be affected by variations in the outputs of the actuators. An example of a commissioning process suitable for correlating the actuators and the sensors is disclosed in a co-pending and commonly assigned U.S. patent application as identified from its U.S. Patent Application Publication No. 20060206291, entitled "COMMISIONING OF SENSORS", now U.S. Pat. No. 7,117,129. Also, visualization of the thermal profiles in the data center may be provided to the users, who can then employ such visualization to optimize placement of equipment in the data center for desired or better environmental management. An example of a computerized tool suitable for the aforementioned visualization is disclosed in co-pending and commonly assigned U.S. patent application Ser. No. 11/699,402, entitled "COMPUTERIZED TOOL FOR ASSESSIGN CONDITIONS IN A ROOM."

In one example, the actuators include computer room air conditioning (CRAC) units capable of varying one or both of volume flow rate and temperature of airflow supplied to sensors in a data center. In this example, the determination of which CRAC units to manipulate, for example, to maintain a particular sensor below a predetermined maximum temperature, is based upon the correlations determined between the CRAC units and the sensors. In addition, the CRAC units may be manipulated according to a selected control scheme as described above.

The systems and methods for a data center EM architecture disclosed herein may also be employed in any reasonably suitable environment containing actuators and sensors, such as, a building containing air conditioning units and sensors. In this regard, although particular reference is made throughout the present disclosure to data centers and CRAC units, it should be understood that the systems and methods disclosed herein may be implemented in other environments. In addition, therefore, the particular references to data centers and CRAC units are for illustrative purposes and are not intended to limit the systems and methods disclosed herein solely to data centers and CRAC units.

With reference first to FIG. 1A, there is shown a simplified perspective view of a section of a data center 100 which may employ various examples of the environmental control system disclosed herein. The terms "data center" are generally meant to denote a room or other space where one or more components capable of generating heat may be situated. In this respect, the terms "data center" are not meant to limit the invention to any specific type of room where data is communicated or processed, nor should it be construed that use of the terms "data center" limits the invention in any respect other than its definition herein above.

The data center 100 is depicted as having a plurality of racks 102a-102n, where "n" is an integer greater than one. The racks 102a-102n may comprise electronics cabinets, aligned in parallel rows and positioned on a raised floor 110. A plurality of wires and communication lines (not shown) may be located in a space 112 beneath the raised floor 110. The space 112 may also function as a plenum for delivery of cooled air from one or more actuators.

Also shown in FIG. 1A are computer room air conditioning (CRAC) units 114a-114n, where "n" is an integer greater than one, which are considered herein as primary actuators 114a-114n. The CRAC units 114a-114n are considered primary actuators 114a-114n because they are configured to manipulate a characteristic of the cooled airflow supplied to the racks 102a-102n through actuation of one or more secondary actuators. The secondary actuators include a device for controlling airflow temperature and a device for controlling the supply flow rates of the cooled air.

The cooled air may be delivered from the space 112 to the racks 102a-102n through vent tiles 118 located between some or all of the racks 102a-102n. The vent tiles 118 are shown as being located between rows 102 and 104 and 106 and 108. The cooled air contained in the space 112 may include cooled air supplied by one or more primary actuators 114a-114n. Thus, characteristics of the cooled air, such as, temperature, pressure, humidity, flow rate, etc., may substantially be affected by the operations of one or more of the primary actuators 114a-114n. In this regard, characteristics of the cooled air at various areas in the space 112 and the cooled air supplied to the racks 102a-102n may vary, for example, due to mixing of the cooled air. In other words, the characteristics of the cooled air supplied to a particular location in the data center 100 may differ from that of the cooled air supplied by a single primary actuator 114a.

At least one condition, for example, temperature, pressure, or humidity, of the cooled air supplied to various areas of the data center 100 may be detected by a distributed sensor network having sensors 120a-120n, where "n" is an integer greater than one. As shown, the sensors 120a-120n are represented as diamonds to distinguish them from other elements depicted in FIG. 1A. In addition, the sensors 120a-120n are depicted as being positioned to detect the at least one condition at the inlets of the racks 102a-102n. In this example, the sensors 120a-120n may environmental sensors such as temperature sensors or humidity sensors. In another example, the sensors 120a-120n may be positioned within the space 112 near respective vent tiles 118 to detect the temperature, pressure, or humidity of the cooled air supplied through the respective vent tiles 118. Thus, although the sensors 120a-120n are depicted as being located on the raised floor 110, the sensors 120a-102n may be positioned at various other reasonably suitable locations, including, for example, near or within some or all of the components 116.

In any regard, the sensors 120a-120n may be employed to detect the at least one condition at various primary actuator 114a-114n settings. In addition, the sensors 120a-120n may be assigned to the families of one or more primary actuators 114a-114n. A primary actuator 114a-114n "family" may be defined as a grouping of sensors 120a-120n that respond to the various primary actuator 114a-114n settings to levels greater than a predefined threshold level. In other words, the sensor 120a may be considered as being in the primary actuator 114a family if the response of the sensor 120a exceeds a predefined threshold level at various primary actuator 114a-114n settings. Various manners in which the sensors 120a-120n may be assigned to the one or more primary actuator 114a-114n families is described in greater detail below and also in the co-pending and commonly assigned U.S. Patent Application Publication No. 20060206291, entitled "COMMISIONING OF SENSORS."

The vent tiles 118 may comprise manually or remotely adjustable vent tiles. In this regard, the vent tiles 118 may be manipulated to vary, for example, the mass flow rates of cooled air supplied to the racks 102a-102n.

The racks 102a-102n are generally configured to house a plurality of components 116 capable of generating/dissipating heat, for example, processors, micro-controllers, high-speed video cards, memories, semi-conductor devices, and the like. The components 116 may be elements of a plurality of subsystems (not shown), for example, computers, servers, bladed servers, etc. The subsystems and the components may be operated to perform various electronic functions, for example, computing, switching, routing, displaying, and the like.

The areas between the rows 102 and 104 and between the rows 106 and 108 may comprise cool aisles 122. These aisles are considered "cool aisles" because they are configured to receive cooled airflow from the vent tiles 118, as generally indicated by the arrows 124. In addition, and as shown, the racks 102a-102n generally receive cooled air from the cool aisles 122. The aisles between the rows 104 and 106, and on the rear sides of rows 102 and 108, are considered hot aisles 126. These aisles are considered "hot aisles" because they are positioned to receive air that has been heated by the components 116 in the racks 102a-102n, as indicated by the arrows 128. It should be understood that the designations "cool aisles" and "hot aisles" are merely descriptive of the particular arrangement of the data center 100, and alternative embodiments are contemplated wherein the data center 100 may be arranged such that there are no separate "cool aisles" or "hot aisles" without deviating from the scope of the present disclosure.

The sides of the racks 102a-102n that face the cool aisles 122 may be considered as the fronts of the racks 102a-102n and the sides of the racks 102a-102n that face away from the cool aisles 122 may be considered as the rears of the racks 102a-102n. For purposes of simplicity and not of limitation, this nomenclature will be relied upon throughout the present disclosure to describe the various sides of the racks 102a-102n. Although not shown, the racks 102a-102n may be positioned with their rear sides adjacent to one another (wherein there is no longer any hot aisle). In this example, the vent tiles 118 may be provided in each aisle 122 and 126. In addition, the racks 102a-102n may comprise outlets on top panels thereof to enable heated air to flow out of the racks 102a-102n.

As described herein above, the primary actuators 114a-114n generally operate to cool received heated air as indicated by the arrows 128. In addition, the primary actuators 114a-114n may supply the racks 102a-102n with airflow that has been cooled and humidity-controlled (at rack inlets), through any reasonably suitable known manners and may thus comprise widely available, conventional CRAC units. For example, the primary actuators 114a-114n may comprise vapor-compression type air conditioning units, chilled water air conditioning units, etc.

Also shown in FIG. 1A is a controller 130 configured to perform various functions in the data center 100. The controller 130 may receive data from the primary actuators 114a-114n and the sensors 120a-120n and may perform various computations on the data. In one regard, the controller 130 may operate to assign the sensors 120a-120n into one or more primary actuator 114a-114n families. According to an example, the controller 130 may implement the commissioning procedures noted earlier to assign the sensors 120a-120n into the one or more primary actuator 114a-114n families.

The controller 130 may also operate the primary actuators 114a-114n based upon the correlations between the primary actuators 114a-114n and the sensors 120a-120n. In operating the primary actuators 114a-114n, the controller 130 may select and implement one or more control schemes as described in greater detail herein below.

Although the controller 130 is illustrated in FIG. 1A as comprising a component separate from the components 116 housed in the racks 102-108, the controller 130 may comprise one or more of the components 116 without departing from a scope of the data center 100 disclosed herein. In addition, or alternatively, the controller 130 may comprise software configured to operate on a computing device, for example, one of the components 116.

Figure 1B:
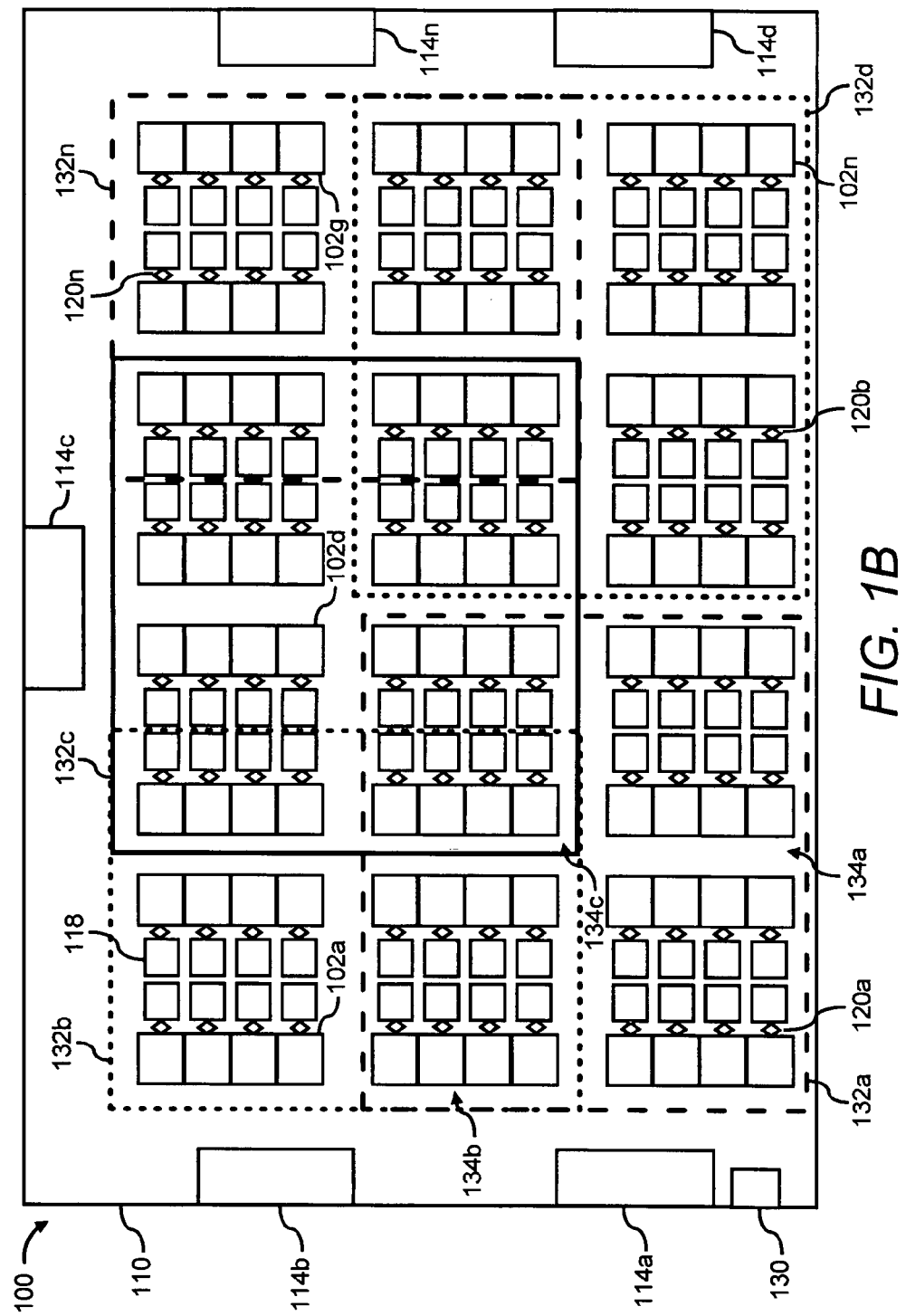
FIG. 1B is a simplified plan view of the data center depicted in FIG. 1A.

With reference now to FIG. 1B, there is shown a simplified plan view of the data center 100 depicted in FIG. 1A. The data center 100 is shown as including primary actuators 114a-114n positioned at various locations throughout the data center 100. A plurality of vent tiles 118 are also illustrated in FIG. 1B and are configured to deliver cooled airflow to racks 102a-102n as described above. It should be appreciated that the data center 100 may include any reasonably suitable number of racks 102a-102n and primary actuators 114a-114n without departing from the data center 100 illustrated in FIG. 1B.

As described herein above, the vent tiles 118 and the racks 102a-102n are positioned on a raised floor 110, beneath which lies a space 112 (FIG. 1A). The space 112 is in fluid communication with the primary actuators 114a-114n and generally operates, in one respect, as a plenum for supplying cooling airflow from the primary actuators 114a-114n to be delivered through the vent tiles 118. In most instances, the space 112 may comprise a relatively open space that is accessible by cooling airflow supplied by a plurality of the primary actuators 114a-114n. In this regard, the cooling airflow supplied by the primary actuators 114a-114n may mix in the space 112. Therefore, the cooling airflow supplied to the racks 102a-102n by the vent tiles 118 may have originated from more than one of the primary actuators 114a-114n.

Although particular reference is made throughout the present disclosure to a raised floor 110, it should be understood that various other types of cooling arrangements may be employed without departing from the systems and methods disclosed herein. For example, the data center 100 may include a lowered ceiling which may also include a space that is operable as a plenum. In addition, or alternatively, the data center 100 may include ceiling mounted heat exchangers, in-row coolers, rack-mounted coolers, or any other cooling units that are operable to provide cool air to a shared environment.

Also shown in FIG. 1B are the sensors 120a-120n, which are illustrated as being positioned with respect to each of the racks 102a-102n. As also stated above, the sensors 120a-120n may also, or in the alternative, be positioned to detect the at least one condition within the space 112. In addition, the sensors 120a-120n may comprise sensors contained in some or all of the components 116. As a further example, the sensors 120a-120n may be positioned near or within the primary actuators 114a-114n. In any regard, the sensors 120a-120n may be grouped in various primary actuator 114a-114n families based upon various criteria. The various primary actuator 114a-114n families 132a-132n corresponding to respective primary actuators 114a-114n are illustrated in FIG. 1B. As shown, the sensors 120a-120n are considered as being within the families 132a-132n of those primary actuators 114a-114n.

Some of the sensors 120a-120n, for example, the sensors 120a-120n in a first section 134a may be included in the family 132a of a single primary actuator 114a. Some of the other sensors 120a-120n, for example, the sensors 120a-120n in a second section 134b may be included in the families 132a and 132b of two primary actuators 114a and 114b. In addition, some of the sensors 120a-120n, for example, the sensors 120a-120n in a third section 134c may be included in the families 132a-132c of three primary actuators 114a-114c. As such, for example, one or more of the sensors 120a-120n may belong to more than one primary actuator 114a-114n family.

It should, in any regard, be understood that the families 132a-132n depicted in FIG. 1B are for purposes of illustration and are not intended to limit the data center 100 and its components in any respect. It should also be understood that the depiction of the families 132a-132n in FIG. 1B are for illustrative purposes only and are not meant to limit the data center 100 in any respect.

Figure 2:
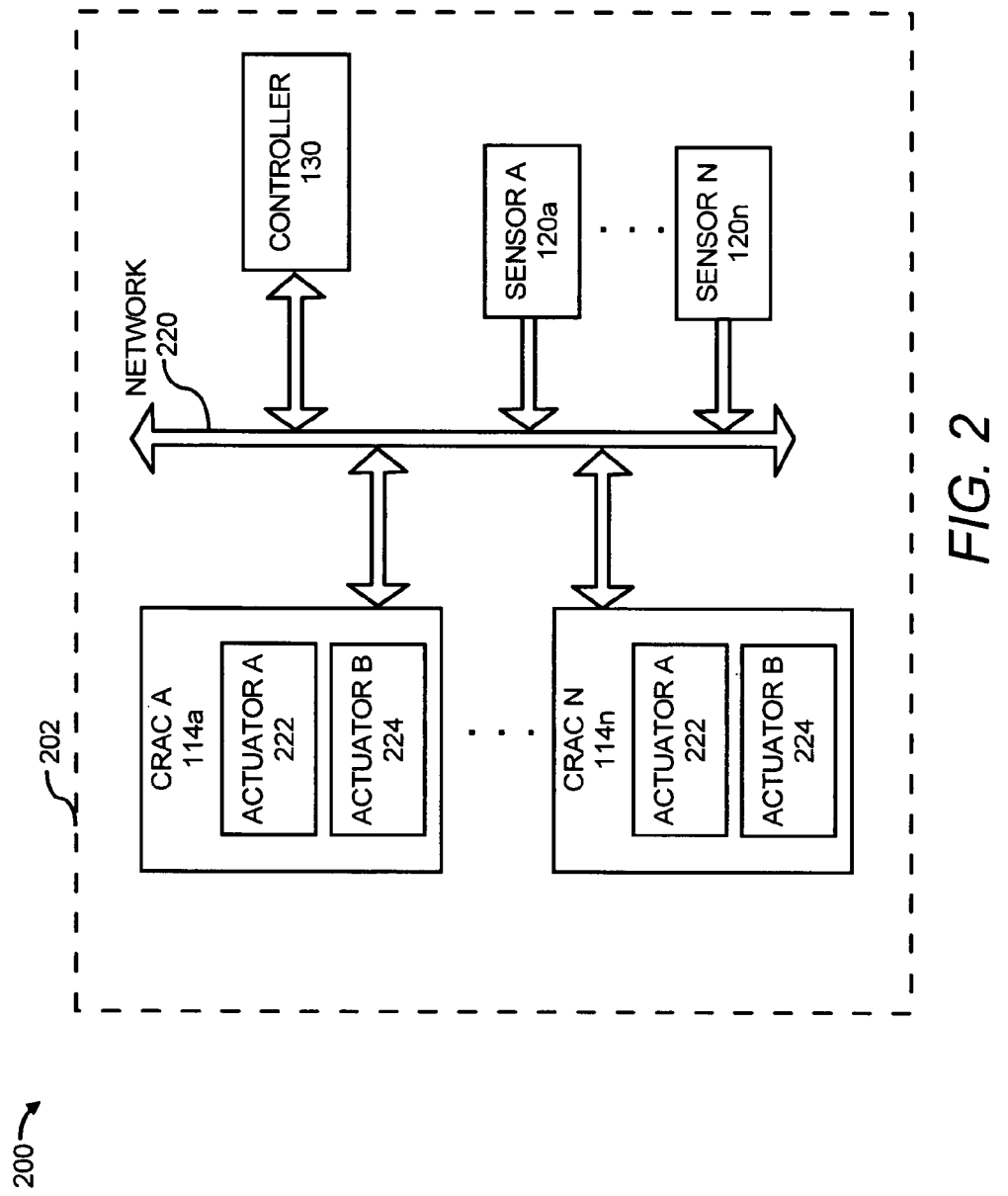
FIG. 2 is a block diagram of a sensor commissioning system according to an embodiment of the invention.

FIG. 2 illustrates an environmental control system 202 operable to provide environmental management of the data center 100. It should be understood that the following description of the environmental control system 202 is but one manner of a variety of different manners in which such a system may be configured. In addition, it should be understood that the environmental control system 202 may include additional components and that some of the components described herein may be removed and/or modified without departing from the scope of the environmental control system 202. For example, the environmental control system 202 may include any number of sensors, memories, processors, CRAC units, etc., as well as other components, which may be implemented in the operations of the environmental control system 202.

Generally speaking, the environmental control system 202 is employed to control the primary actuators 114a-114n, to thereby control at least one environmental condition at the sensor locations 120a-120n. A determination of primary actuator 114a-114n families may be used to determine which of the primary actuators 114a-114n are to be manipulated in response to conditions detected by the sensors 120a-120n. The control over the primary actuators 114a-114n may be effectuated through manipulation of one or more secondary actuators 222 and 224. One of the secondary actuators 222 may comprise a variable frequency drive (VFD) for controlling an airflow volume varying device, such as a blower or fan. The other secondary actuator 224 may comprise a device for controlling the temperature of the cooled air supplied by the primary actuators 114a-114n, such as water chillers, compressors, valves, etc. Thus, the secondary actuator 224 may depend upon the type of primary actuator 114a-114n in which the secondary actuator 224 is located. For example, if a primary actuator 114 comprises a vapor-compression type CRAC unit, a secondary actuator 224 therein may comprise a variable speed compressor configured to vary the temperature of the airflow supplied by the CRAC unit. Likewise, if a primary actuator 114 comprises a chilled-water (or any other refrigerant type) CRAC unit, a secondary actuator 224 therein may comprise a two or three-way valve configured to control the temperature of a coolant configured to receive heat from the airflow.

The secondary actuators 224 may also comprise devices for varying other characteristics of the airflow supplied by the primary actuators 114a-114n. The secondary actuators 224 may comprise, for example, humidifiers/dehumidifiers configured to vary the humidity of the airflow supplied by the primary actuators 114a-114n. In this example, the sensors 120a-120n may comprise humidity sensors. In addition, therefore, the primary actuators 114a-114n in this example may operate to maintain the humidity levels at the sensor 120a-120n locations within predefined thresholds.

In any respect, the controller 130 is configured to control the primary actuators 114a-114n and thus the secondary actuators 222 and 224. Instructions from the controller 130 may be transmitted over a network 221 that operates to couple the various components of the environmental control system 202. Although not shown, the controller 130 may be equipped with or have access to software and/or hardware to enable the controller 130 to transmit and receive data over the network 221. The network 221 generally represents a wired or wireless structure in the data center 100 for the transmission of data between the various components of the environmental control system 202. The network 221 may comprise an existing network infrastructure or it may comprise a separate network configuration installed for the purpose of environmental control by the controller 130.

The sensors 120a-120n may be configured to transmit collected data over the network 221 for storage and processing. As stated above, the sensors 120a-120n may comprise sensors configured to detect at least one environmental condition at various locations in the data center 100. The at least one environmental condition may comprise temperature, humidity, or pressure and the sensors 120a-120n may be configured to detect at least one of these conditions. The sensors 120a-120n may also be configured to compare detected environmental conditions with predefined environmental conditions to determine differences between the detected environmental conditions and the predefined environmental conditions. The sensors 120a-120n may transmit these differences as signals to the controller 130, where the strengths of the signals correspond to the difference levels. In addition, the controller 130 may vary operations of the actuator control module 218 according to the types of environmental condition detected and the magnitudes of the signals received from the sensors 120a-120n.

Commissioning of Sensors

The commissioning of the sensors 120a-n with respect to the primary actuators 114a-n, as disclosed in a co-pending and commonly assigned U.S. patent application as identified from its U.S. Patent Application Publication No. 20060206291, entitled "COMMISIONING OF SENSORS", now U.S. Pat. No. 7,117,129, is described below with reference to FIGS. 3-6.

Figure 3:
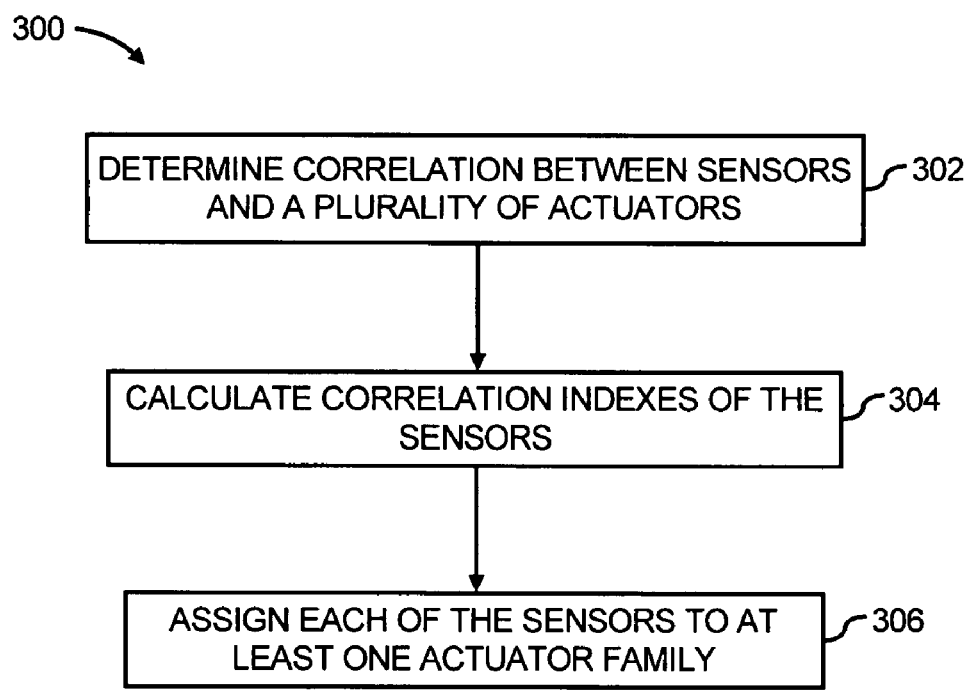
FIG. 3 illustrates a flow diagram of an operational mode of a method for commissioning sensors, according to an embodiment of the invention.

FIG. 3 illustrates a flow diagram of an operational mode 300 of a method for commissioning sensors, according to an example. For illustrative purposes only and not to be limiting thereof, the operation mode 300 is discussed in the context of the block diagram 200 illustrated in FIG. 2.

The operational mode 300 may be implemented to commission the sensors 120a-120n with respect to a plurality of actuators, for example, CRAC units 114a-114n. More particularly, the operational mode 300 may be implemented to relate the sensors 120a-120n to the actuators. In addition, those sensors 120a-120n that are influenced to a predefined level by a particular actuator are considered to be within that actuator's family.

In the operational mode 300, the controller 130 may determine correlations between the sensors 120a-120n and a plurality of actuators at step 302. Manners in which these correlations may be determined are described in greater detail herein below with respect to the operational modes 400 (FIG.

Figure 6:
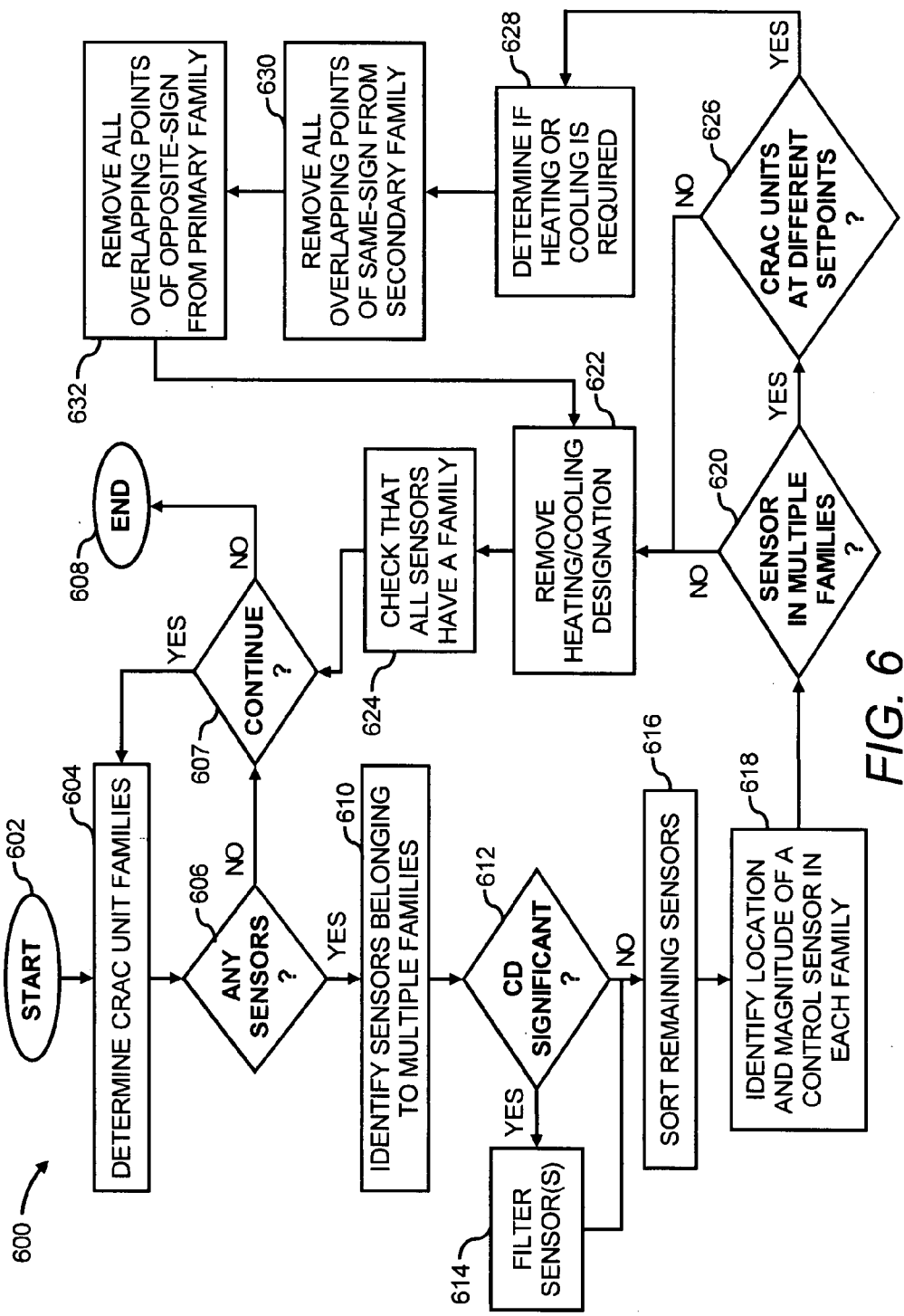
FIG. 6 illustrates a flow diagram of an operational mode for optionally filtering sensors belonging to multiple actuator families, according to an embodiment of the invention.
Figure 7:
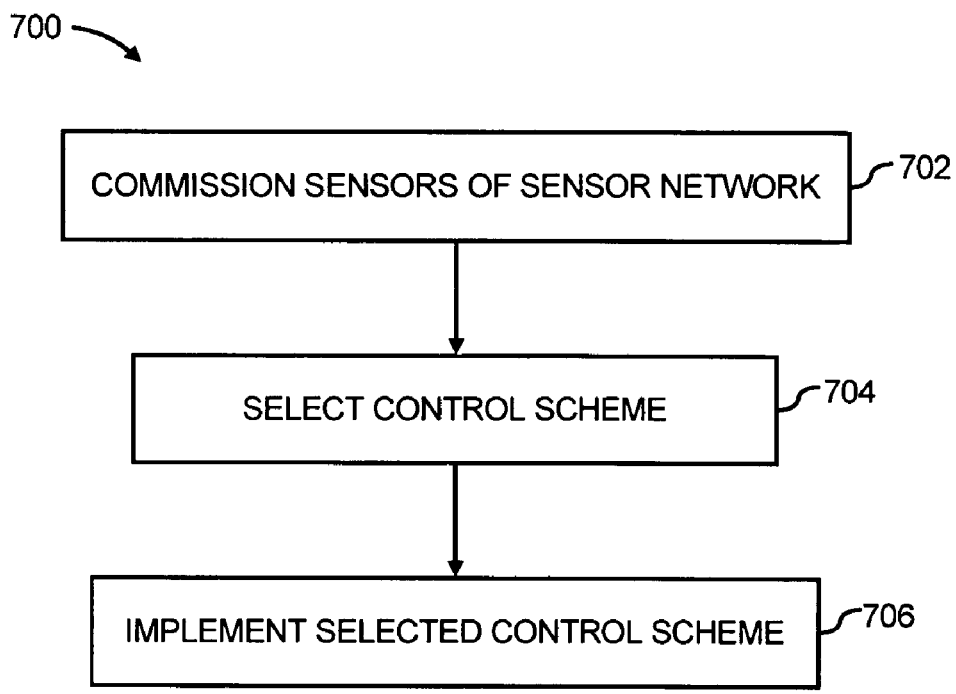
FIG. 7 illustrates a flow diagram of a method for controlling temperature using a sensor network, according to an embodiment of the invention.

4A), 600 (FIG. 6), and 700 (FIG. 7). The controller 130 may also calculate correlation indexes of the sensors 120a-120n, which are functions of the plurality of actuator settings and a particular actuator, from the correlations at step 304. Examples of how the correlation indexes of the sensors 120a-120n may be calculated are described in greater detail herein below with respect to the operational modes 450 (FIG. 4B) and 470 (FIG. 4C). In addition, the controller 130 may assign each of the sensors 120a-120n to at least one actuator family at step 306. Again, a more detailed description of this step is provided below with respect to the operational modes 450 (FIG. 4B) and 470 (FIG. 4C).

Figure 4A:
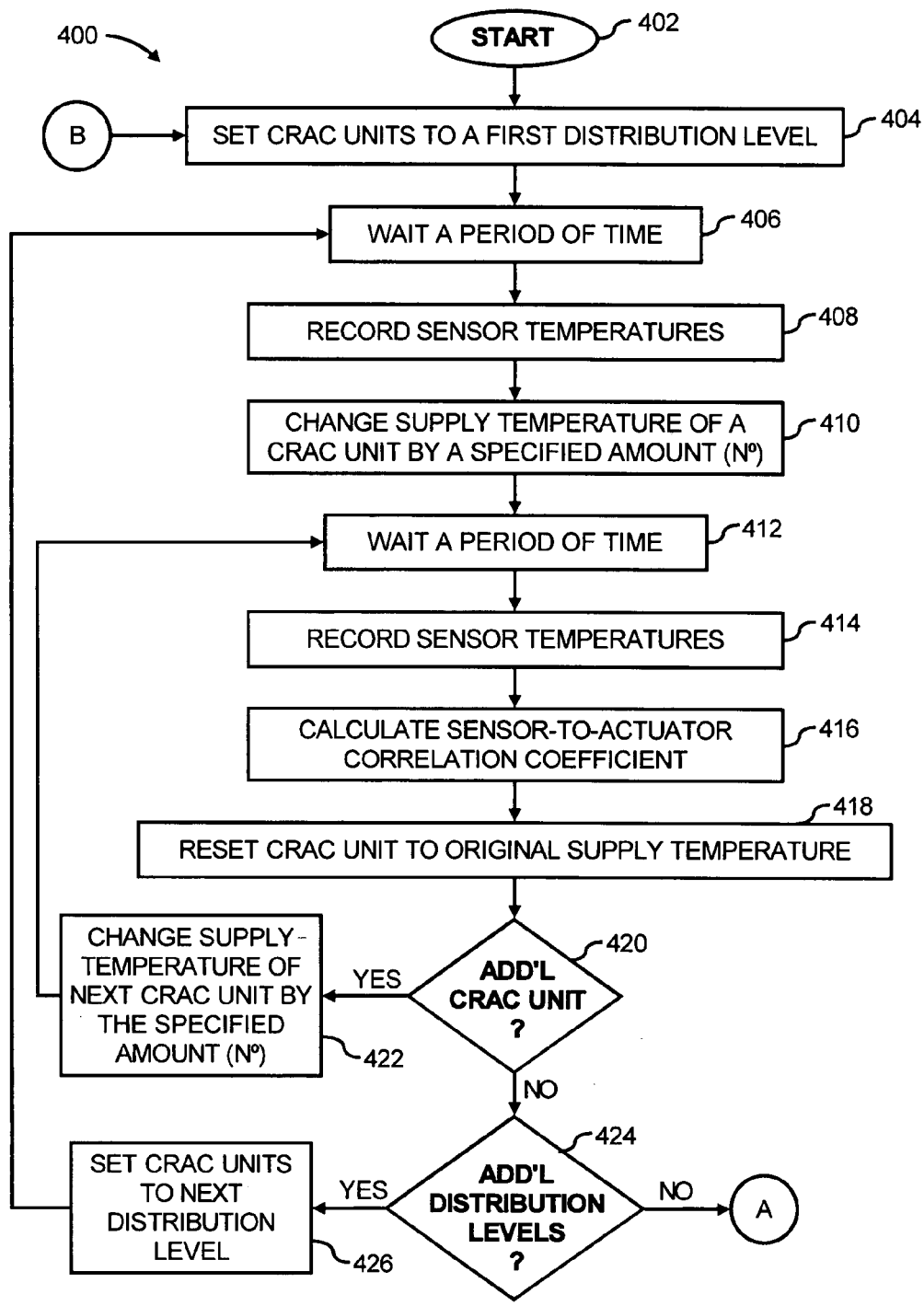
FIG. 4A illustrates a flow diagram of an operational mode of a method for commissioning temperature sensors, according to an embodiment of the invention.

With particular reference now to FIG. 4A, there is shown a flow diagram of an operational mode 400 of a method for commissioning sensors, according to an example. It is to be understood that the following description of the operational mode 400 is but one manner of a variety of different manners in which an embodiment of the invention may be practiced. It should also be apparent to those of ordinary skill in the art that the operational mode 400 represents a generalized illustration and that other steps may be added or existing steps may be removed, modified or rearranged without departing from a scope of the operational mode 400.

The operational mode 400 may be implemented to commission the sensors 120a-120n in a data center 100. More particularly, the operational mode 400 may be implemented to relate the sensors 120a-120n to the CRAC units 114a-114n. In addition, those sensors 120a-120n that are influenced to a predefined level by a particular CRAC unit 114a-114n are considered to be within that CRAC unit's 114a-114n family.

The operational mode 400 may be initiated at step 402 in response to any of a number of stimuli or conditions. For example, the operational mode 400 may be initiated with activation of the components in the data center 100, such as, the CRAC units 114a-114n. In addition, or alternatively, the operational mode 400 may be manually initiated or the controller 130 may be programmed to initiate the operational mode 400 at various times, for a set duration of time, substantially continuously, etc.

Once initiated, the controller 130 may set the CRAC units 114a-114n to a first distribution level at step 404. The first distribution level may comprise a first flow rate (VFD setting) and temperature of the airflow supplied by the CRAC units 114a-114n, which are common for the CRAC units 114a-114n. In addition, the controller 130 may wait for a period of time at step 406, prior to recording temperature information received from the sensors 120a-120n at step 408. The controller 130 may allow this time period to elapse in order to enable a relatively steady-state of operation to be reached. The time period may be based upon, for example, the loading on the CRAC units 114a-114n. In addition, during the time period at step 406, the controller 130 may determine a median temperature reading for one or more of the sensors 120a-120n in the event that the temperatures detected by one or more of the sensors 120a-120n oscillate during the time period. In this case, the temperature measurements recorded at step 408 may comprise time-averaged values.

Following elapse of the time period at step 406, the controller 130 may record the temperature measurements obtained by the sensors 120a-120n, as indicated at step 408. As stated above, the temperature information may be stored through implementation of the data storage module 216. The controller 130 may instruct a CRAC unit 114a to change the temperature of the airflow by a specified amount (N°) at step 410. The specified amount (N°) may comprise an amount that differs from the first distribution level temperature by a relatively discernable amount. Thus, for example, the specified amount (N°) may range from, for example, ±1° C. to 20° C. or more. The CRAC unit 114a may change the temperature of the airflow by the specified amount (N°) through, for example, varying operations of the actuator B 224, which may comprise a compressor, a chiller, a valve, etc.

The controller 130 may again wait for a period of time at step 412, prior to recording temperature information received from the sensors 120a-120n at step 414. The controller 130 may allow this time period to elapse in order to enable a relatively steady-state of operation to be reached following the supply air temperature change in the CRAC unit 114a. Following elapse of the time period at step 412, the controller 130 may again record the temperature measurements obtained by the sensors 120a-120n, as indicated at step 414. In addition, during the time period at step 412, the controller 130 may determine a median temperature reading for one or more of the sensors 120a-120n in the event that the temperatures detected by one or more of the sensors 120a-120n oscillate during the time period. In this case, the temperature measurements recorded at step 412 may comprise time-averaged values.

At step 416, the controller 130 may calculate a sensor-to-actuator correlation coefficient ($C_i$) for the sensors 120a-120n (i). The actuators are the CRAC units 114a-114n. As such, the correlation coefficient ($C_i$) is a function of the relative level of influence the CRAC units 114a-114n have over the sensors 120a-120n. Thus, for example, the higher the correlation coefficient ($C_i$) value for a sensor 120a-120n, the greater the influence a CRAC unit 114a-114n has over that sensor 120a-120n. In addition, the calculated correlation coefficients ($C_i$) for the CRAC units 114a-114n and the sensors 120a-120n may be stored in the memory 204.

Although the correlation coefficients ($C_i$) may be determined through any number of suitable correlation algorithms, the following algorithm may be employed to calculate the correlation coefficients ($C_i$) of the sensors 120a-120n.

$$C_i = \frac{(T_1 - T_2)}{N}. \qquad \text{Equation (1)}$$

In this equation, $T_1$ is the temperature measurement recorded at step 408 and $T_2$ is the temperature measurement recorded at step 414. In addition, N is the specified amount of supply air temperature change for the CRAC unit 114a at step 410.

By way of example, if the temperature of the sensor 120a recorded at step 408 ($T_1$) is 20° C., the temperature of the sensor 120a recorded at step 414 ($T_2$) is 25° C., and the change in temperature of the supply air (N) is +10° C., the correlation coefficient ($C_i$) between the sensor 120a and the CRAC unit 114a is 0.5. As another example, if the temperature of the sensor 120b recorded at step 408 ($T_1$) is 20° C., the temperature of the sensor 120b recorded at step 414 ($T_2$) is 21° C., and the change in temperature of the supply air (N) is +10° C., the correlation coefficient ($C_i$) between the sensor 120b and the CRAC unit 114a is 0.10. As such, the sensor 120a has a greater correlation to the CRAC unit 114a. Thus, changes to the supplied airflow from the CRAC unit 114a are likely to have a greater impact on conditions at the sensor 120a as compared with the sensor 120b.

At step 418, the temperature of the CRAC unit 114a may be reset to the temperature at the first distribution level set at step 404. In addition, it may be determined whether correlations between other CRAC units 114b-114n and the sensors 120a-120b are to be made at step 420. If it is determined that additional correlations are to be determined, the temperature of the airflow supplied by a next CRAC unit 114b may be varied by the specified amount (N°) at step 422. The temperature of the airflow supplied by the CRAC unit 114b may be varied in manners as described herein above with respect to step 410.

Following step 422, the controller 130 may again wait for a period of time at step 412, prior to recording temperature information received from the sensors 120a-120n at step 414, as described above. In addition, the controller 130 may calculate a sensor-to-actuator correlation coefficient ($C_i$) for the sensors 120a-120n (i) and the CRAC unit 114b at step 416, as also described above. Moreover, the temperature of the CRAC unit 114b may be reset to the temperature at the first distribution level set at step 404.

Steps 412-422 may be repeated for the remaining CRAC units 114c-114n. In this regard, the correlations between all of the CRAC units 114a-114n and the sensors 120a-120n may be determined and recorded. If there are no further CRAC units 114a-114n for which correlations to the sensors 120a-120n are to be determined, it may be determined as to whether correlations are to be determined at an additional distribution level at step 424. If "yes", the CRAC units 114a-114n may be set to a next distribution level at step 426. The next distribution level may comprise characteristics that differ from the first distribution level. As such, either or both of the flow rate and the temperature of the cooled airflow supplied by the CRAC units 114a-114n may differ from their settings in the first distribution level.

As shown, following step 426, steps 406-424 may be repeated to calculate and record the correlations between the sensors 120a-120n and the CRAC units 114a-114n at the next distribution level. In addition, step 426, and steps 406-424, may be repeated for a number of different distribution levels. For example, these steps may be repeated for a predetermined number of iterations, where the predetermined number of iterations may be chosen according to the desired size of the sensor-to-actuator correlations. In addition, or alternatively, these steps may be repeated for a predetermined period of time. In any regard, once the correlation data has been recorded and no further data is to be collected at different distribution levels, the collected data may be processed in either of two examples, as indicated by the identifier "A".

The first example is illustrated in the flow diagram of an operational mode 450 illustrated in FIG. 4B. As shown in FIG. 4B, following a "no" condition at step 424, the correlation data collected at step 416 for the various distribution levels and CRAC unit 114a-114n settings are fed into a neural network teaching algorithm, as indicated at step 452. The neural network teaching algorithm may, for example, comprise the correlation determination module 214 depicted in FIG. 2. In addition, the correlation coefficients ($C_i$) may be used to teach the neural network of the initial relationships between the CRAC unit 114a-114n settings and the conditions detected by the sensors 120a-120n. The neural network may use the initial relationships to estimate correlation coefficients ($C_i$) relating to various CRAC unit 114a-114n settings as described in greater detail herein below.

Figure 5:
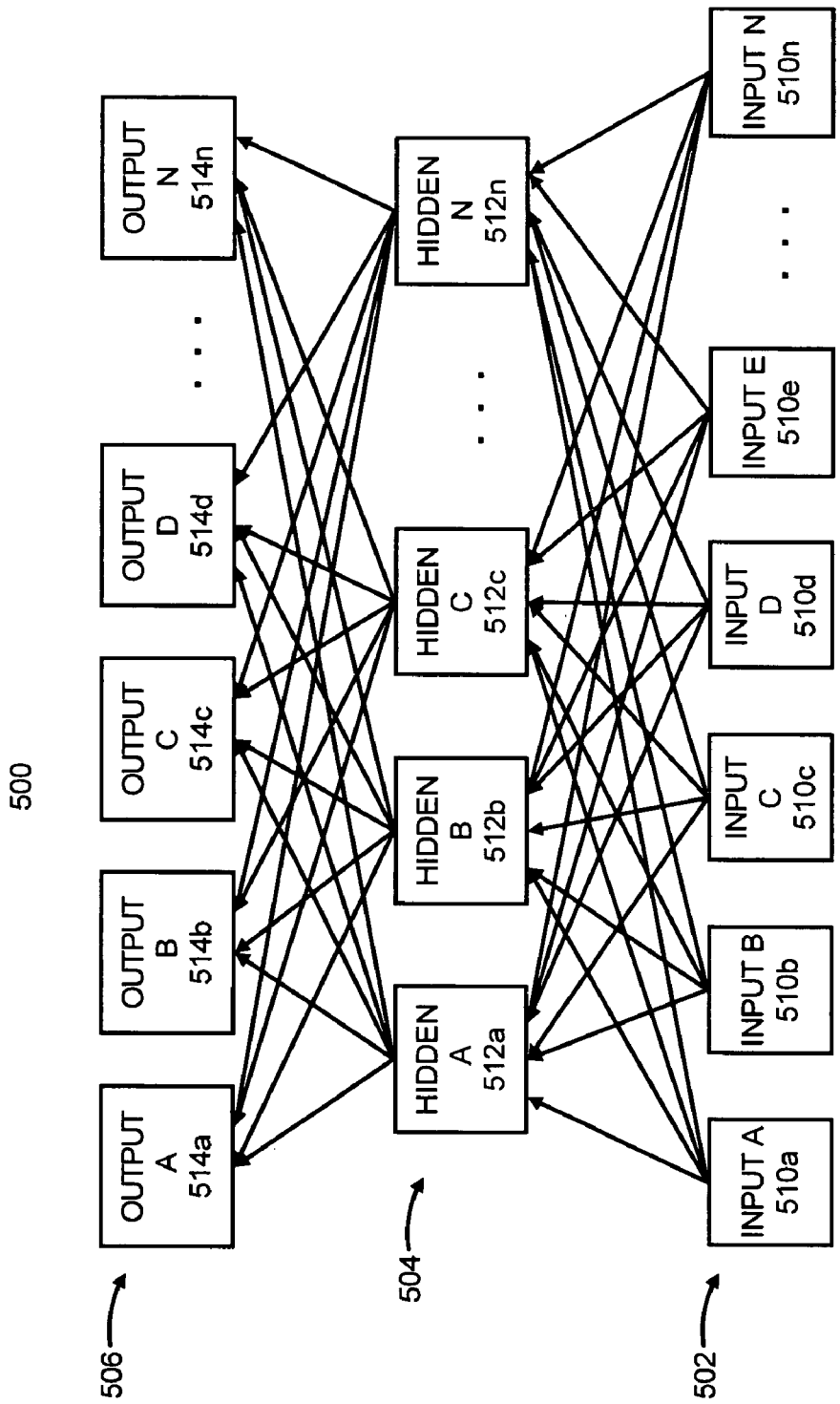
FIG. 5 shows a example of a neural network created through implementation of the operational mode depicted in FIG. 4B, according to an embodiment of the invention.

The neural network teaching algorithm may be implemented to generate a neural network as indicated at step 454. A diagram of a neural network 500 generated at step 454, according to an example, is also illustrated in FIG. 5. As shown in FIG. 5, the neural network 500 includes an input layer 502, a hidden layer 504, and an output layer 506. The input layer 502 includes input neurons A-N 510a-510n, the hidden layer 504 includes hidden neurons A-N 512a-512n, and the output layer 506 includes output neurons A-N 514a-514n, where "n" is an integer greater than one. The ellipses " . . . " positioned between various neurons in the neural network 500 generally indicate that the neural network 500 may include any reasonably suitable number of additional neurons.

The input neurons 510a-510n may represent CRAC unit 114a-114n setpoints of the neural network 500, and may comprise, for example, volume flow rates of the airflow supplied by the CRAC units 114a-114n (VFD speeds), CRAC unit 114a-114n supply temperatures, etc. The output neurons 514a-514n may comprise correlation coefficients ($C_i$) of the sensors 120a-120n. The correlation coefficients ($C_i$) may be fed into the neural network teaching algorithm to teach the neural network 500 of the initial relationships between the CRAC unit 114a-114n setpoints and the correlation coefficients ($C_i$) the sensors 120a-120n. In this regard, the output neurons 514a-514n may comprise the correlation coefficients ($C_i$) determined at step 416, which the teaching algorithm may implement to generate neural network 500.

In addition, based upon the initial relationships between the CRAC unit (i) setpoints ($X_i$) and the correlation indexes ($Y_j$) for the sensors (j), the neural network 500 may determine weights ($W_{ij}$) between the CRAC unit (i) setpoints ($X_i$) and the correlation indexes ($Y_j$). The weights, which are assigned to each interaction, may be randomly selected and modified to reduce the mean square error as the learning epoch proceeds. In addition, the relationships between various CRAC unit (i) setpoints ($X_i$) and correlation coefficients ($Y_j$) for the sensors (j) may be defined by the following equation:

$$Y_j = \text{Sum}(W_{ij} * X_i + B_j), \text{ for all the CRAC units } (i). \quad \text{Equation (2)}$$

In this equation, $B_j$ are offsets of the correlation coefficients ($Y_j$). Equation (2) may be employed in the neural network 500 to determine the correlation coefficients ($Y_j$) that correspond to various CRAC unit (i) setpoints, which were not fed into the neural network 500 at step 452.

In addition, the number of neurons 510a-510n, 512a-512n, and 514a-514n per layer 502-506 may be modified to increase the accuracy of the neural network model depicted in FIG. 5. By way of example, the number of hidden neurons 512a-512n may be increased to thereby increase the complexity in the relationship between the input neurons 510a-510n and the output neurons 514a-514n. The final model may comprise layers 502-506 of neurons 510a-510n, 512a-512n, and 514a-514n with weights and connections with associated biases that link up the input neurons 510a-510n to the output neurons 514a-514n. In one respect, therefore, the neural network 500 may be employed to determine the correlation coefficients ($C_i$) of the sensors 120a-120n that were not determined through implementation of the method 400. In this regard, for example, the neural network 500 may be capable of interpolating correlation coefficients ($C_i$) for various CRAC unit 114a-114n setpoints.

Referring back to FIG. 4B, at step 456, correlation indexes ($C_{i,j,k}$) of the sensors 120a-120n may be determined from the neural network 500 generated at step 454. The correlation indexes ($C_{i,j,k}$) for the sensors 120a-120n may broadly be defined as functions of the VFD speeds for a plurality of CRAC units 114a-114n and a particular CRAC unit 114a. The function may be in the form of:

$$C_{i,j,k} = F(\text{VFD}_1, \text{VFD}_2, \ldots, \text{VFD}_n, \text{CRAC}_k), \text{ where}$$
$C_{i,j,k}$ is the correlation index for the sensor (i),
$\text{VFD}_1 \ldots \text{VFD}_n$ are various VFD setpoints (j) for
the CRAC units 114a-114n, and the $\text{CRAC}_k$
refers to a particular CRAC unit (k). $\quad$ Equation (3)

At step 458, the correlation indexes ($C_{i,j,k}$) of the sensors 120a-120n may be compared to a predefined threshold value.

The predefined threshold may be based upon an infrastructure efficiency as determined, for example, by an average value for the correlation coefficients. A high average value of correlation coefficients generally represents an efficient infrastructure, whereas a low average value of correlation coefficients represents a less efficient infrastructure. In any event, it may be determined as to which of the correlation indexes ($C_{i,j,k}$) exceed the predefined threshold value at step 458. For those correlation indexes ($C_{i,j,k}$) that exceed the predefined threshold value, the associated sensor (i) may be assigned to the particular CRAC unit (k) for the VFD setpoints (j) contained in the function of Equation (3) at step 460. In addition, the correlation indexes ($C_{i,j,k}$) for a particular sensor (i) may vary with varying thermal management requirements or varying VFD setpoints (j). In other words, the correlations between any sensor (i) and any CRAC unit (k) are functions of the VFD setpoints (j). Thus, although a sensor (i) may be strongly correlated with a CRAC unit (k) for a particular set of VFD setpoints (j), the same sensor (i) may not be strongly correlated with the same CRAC unit (k) at a different set of VFD setpoints (j).

The remaining sensors 120a-120n may either be assigned to respective CRAC unit 114a-114n families based upon these criteria. In addition, the sensors 120a-120n may belong to multiple families for any given set of VFD setpoints (j). The correlating information regarding the CRAC unit 114a-114n families and their associated sensors 120a-120n may be stored, for example, in a look-up table, in a map, etc.

The sensors 120a-120n may be assigned to respective CRAC units 114a-114n through implementation of the operational modes 400 and 450, thereby commissioning the sensors 120a-120 with respect to the CRAC units 114a-114n in a data center 100. The commissioning process depicted in the operational modes 400 and 450 may include additional steps. For example, data may be historically logged and periodically fed to the neural network teaching algorithm to update the CRAC unit 114a-114n families. This data may also be used to refine the estimates determined by the neural network 500, such as, for example, in the event that an initial commissioning process utilized a relatively limited number of VFD settings to, for example, reduce the time required to perform the initial commissioning process.

Following either or both of steps 458 and 460, it may be determined as to whether the operational modes 400 and 450 are to continue at step 462. The determination of whether to continue the operation modes 400 and 450 may be based upon whether it is desired to, for example, commission the sensors 120a-120n on an ongoing basis. Thus, for example, the operational modes 400 and 450 may be continued at step 462 to substantially continuously update the CRAC unit 114a-114n families. If a "yes" condition is reached at step 462, the operational modes 400 and 450 may be repeated beginning at step 404. If, however, a "no" condition is reached at step 462, the operational modes 400 and 450 may end as indicated at step 464.

The second example is illustrated in the flow diagram of an operational mode 470 illustrated in FIG. 4C. As shown in FIG. 4C, following a "no" condition at step 424, the correlation data collected at step 416 for the various distribution levels and CRAC unit 114a-114n settings are fed into a curve fitting algorithm, as indicated at step 472. The curve fitting algorithm may, for example, comprise the correlation determination module 214 depicted in FIG. 2. In addition, the curve fitting algorithm may comprise any reasonably suitable, traditional curve fitting algorithm used to fit a multi-variant, polynomial function to the data set that defines the correlation index ($C_{i,j,k}$).

The curve fitting algorithm may be implemented to determine the correlation indexes ($C_{i,j,k}$) for the sensors 120a-120n at step 474. Although a number of various equations may be employed, an example of a polynomial function for two CRAC units 114a-114b may be represented as follows:

$$C_{i,j,k} = \sum_{m=0}^{M}\sum_{n=0}^{M} a_l VFD_m VFD_n, \qquad \text{Equation (4)}$$

where i is the sensor 120a-120n number, j is the CRAC unit 114a-114n distribution set, k is the CRAC unit 114a-114n number, and $a_l$ is a coefficient.

The summation in Equation (4) may be expanded to determine the correlation indexes ($C_{i,j,k}$) with additional CRAC units 114a-114n. In any regard, the data from the CRAC unit 114a-114n distribution set (j) may be used to define the coefficients as of Equation (4). Although not shown, a filtering process may be performed following step 416 to reduce the number of CRAC units 114a-114n to consider for various sensors 120a-120n. More particularly, for example, those CRAC units 114a-114n having a relatively limited effect on a sensor 120a may be removed from the calculation of the coefficients (a), as described, for example, with respect to step 814 in FIG. 8 below.

In addition, an equation representing the multi-variant, polynomial function may be implemented for each of the sensors 120a-120n. In addition, the equation may be used to calculate the coefficients (a) for each of the sensors 120a-120n. A standard statistical regression method, for example, through software such as, MATLAB, MS EXCEL, MATHEMATICA, and the like, may be employed to calculate the coefficients (a), with the remaining inputs of the equation having been determined through implementation of the operational mode 400.

At step 476, the correlation indexes ($C_{i,j,k}$) of the sensors 120a-120n may be compared to a predefined threshold value. The predefined threshold value may be based upon an infrastructure efficiency as determined, for example, by an average value for the correlation coefficients. A high average value generally represents an efficient infrastructure, whereas a low average value represents a less efficient infrastructure. In any event, it may be determined as to which of the correlation indexes ($C_{i,j,k}$) exceed the predefined threshold value at step 476. For those correlation indexes ($C_{i,j,k}$) that exceed the predefined threshold value, the associated sensor (i) may be assigned to the particular CRAC unit (k) for the VFD setpoints (j) contained in the function of Equation (3) at step 478. In addition, the correlation indexes ($C_{i,j,k}$) for a particular sensor (i) may vary with varying thermal management requirements or varying VFD setpoints (j). In other words, the correlations between any sensor (i) and any CRAC unit (k) are functions of the VFD setpoints (j). Thus, although a sensor (i) may be strongly correlated with a CRAC unit (k) for a particular set of VFD setpoints (j), the same sensor (i) may not be strongly correlated with the same CRAC unit (k) at a different set of VFD setpoints (j).

The remaining sensors 120a-120n may either be assigned to respective CRAC unit 114a-114n families based upon these criteria. In addition, the sensors 120a-120n may belong to multiple families for any given set of VFD setpoints (j). The correlating information regarding the CRAC unit 114a-114n families and their associated sensors 120a-120n may be stored, for example, in a look-up table, in a map, etc.

The sensors 120a-120n may be assigned to respective CRAC units 114a-114n through implementation of the operational modes 400 and 470, thereby commissioning the sensors 120a-120 with respect to the CRAC units 114a-114n. Following either or both of steps 476 and 478, it may be determined as to whether the operational modes 400 and 470 are to continue at step 480. The determination of whether to continue the operation modes 400 and 470 may be based upon whether it is desired to, for example, commission the sensors 120a-120n on an ongoing basis. Thus, for example, the operational modes 400 and 470 may be continued at step 480 to substantially continuously update the CRAC unit 114a-114n families. If a "yes" condition is reached at step 480, the operational modes 400 and 470 may be repeated beginning at step 404. If, however, a "no" condition is reached at step 480, the operational modes 400 and 470 may end as indicated at step 484.

With reference now to FIG. 6, there is shown a flow diagram of an operational mode 600 for optionally filtering sensors 120a-120n belonging to multiple actuator or CRAC unit 114a-114n families. The operational mode 600 may comprise a filtering algorithm stored in the memory 204 that may be implemented by the controller 130. The controller 130 may also update the information stored in the data storage module 216 based upon the results of the filtering algorithm.

The operational mode 600 may be initiated at step 602 in response to any of a number of stimuli or conditions. For example, the operational mode 600 may be initiated with activation of the components in the data center 100, such as, the CRAC units 114a-114n. In addition, or alternatively, the operational mode 600 may be manually initiated or the controller 130 may be programmed to initiate the operational mode 600 at various times, for a set duration of time, substantially continuously, etc.

At step 604, the CRAC unit 114a-114n families may be determined. More particularly, the operational mode 400, 600, or 700 and either of operational 450 or 470 may be performed at step 604 to determine which sensors 120a-120n belong to which CRAC unit 114a-114n families. This information may be stored, for example, in the memory 204. In addition, the controller 130 may access this information to determine whether any of the sensors 120a-120n belong to multiple families at step 606. If none of the sensors 120a-120n belongs to multiple CRAC unit 114a-114n families, it may be determined as to whether the operational mode-600 is to continue at step 607. If it is determined that the operational mode 600 is to continue, the operational mode 600 may be repeated beginning at step 604. In this regard, the operational mode 600 may run in a substantially continuous manner, for example, with each control cycle, to filter sensors 120a-120n belonging to multiple CRAC unit 114a-114n families. In addition, or alternatively, the operational mode 600 may be continued for a predetermined period of time, a predetermined number of iterations, substantially indefinitely, etc. If it is determined that the operational mode 600 is to be discontinued at step 607, the operational mode 600 may end as indicated at step 608. The operational mode 600 may be re-initiated under any of the conditions described with respect to step 604.

However, if at least one sensor 120a-120n is determined to belong to multiple CRAC unit 114a-114n families, the controller 130 may identify those sensors 120a-120n at step 610. In addition, the controller 130 may compare the correlation levels between the sensors 120a-120n and the CRAC units 114a-114n. More particularly, for each of the identified sensors 120a-120n, the controller 130 may determine whether a correlation difference (CD) among the CRAC unit 114a-114n families is significant at step 612. The correlation difference (CD) may be considered as being significant if it exceeds a correlation difference threshold. The correlation difference threshold may be based upon infrastructure efficiency as determined by the average magnitude of correlation coefficients. Thus, for example, the higher the average magnitude of correlation coefficients, the greater the correlation difference threshold.

By way of example, if the sensor 120a has a correlation index of 0.7 to the CRAC unit 114a and a correlation index of 0.1 to the CRAC unit 114b, the correlation difference (CD) between the CRAC unit 114a and the CRAC unit 114b is 0.6. If the correlation difference threshold is 0.5, then the correlation difference between the CRAC unit 114a and the CRAC unit 114b is considered to be significant and a "yes" condition is reached at step 612. However, if the correlation difference threshold is 0.7, then the correlation difference between the CRAC unit 114a and the CRAC unit 114b is considered to be insignificant and a "no" condition is reached at step 612.

As shown in the example above, if the identified sensors 120a-120n are more closely related to a particular CRAC unit 114a-114n, the "yes" condition is reached at step 612. In this regard, the sensor 120a-120n is considered to be significantly affected by that particular CRAC unit 114a-114n. As such, at step 614, those sensors 120a-120n that meet the "yes" condition at step 612 may be filtered out. In other words, those sensors 120a-120n may be removed from further filtering operations described in the operational mode 600.

At step 616, following either or both of the "no" condition at step 612 and the filtering operation at step 614, the remaining identified sensors 120a-120n may be sorted according to whether they require heating or cooling. More particularly, those sensors 120a-120n that require heating may be sorted into one group and those sensors 120a-120n that require cooling may be sorted into another group. Sensors 120a-120n that are considered as requiring "heating" may be defined as sensors 120a-120n whose temperatures may be raised to reach a predefined operating level. Sensors 120a-120n that are considered as requiring "cooling" may be defined as sensors 120a-120n whose temperatures may be lowered to reach the predefined operating level. In addition, or alternatively, the designation of whether sensors 120a-120n require cooling or heating may be based upon a comparison between the temperatures measure by the sensors 120a-120n and a temperature reference matrix.

The sensors 120a-120n may be grouped as indicated at step 616 to substantially prevent sensors 120a-120n assigned to multiple CRAC unit families 114a-114n from causing at least one of the CRAC units 114a-114n to cool and at least another one of the CRAC units 114a-114n to heat. In other words, step 616 may be performed to distinguish the sensors 120a-120n and to substantially prevent CRAC units 114a-114n from competing against each other in attempting to maintain the sensors 120a-120n in their families at their desired temperatures.

At step 618, the identity of a control sensor 120a-120n in each CRAC unit 114a-114n family may be determined. In addition, the magnitude of a temperature difference detected by the control sensor 120a-120n may be determined at step 618. The control sensor 120a-120n may be considered as the sensor 120a-120b having the highest difference between the sensed temperature and a reference temperature for each CRAC unit 114a-114n family. The reference temperature for the sensors 120a-120n may comprise a desired temperature for the sensors 120a-120n and may differ for the sensors 120a-120n. In addition, the magnitude of the temperature difference is the sign and amount of the difference in sensed and reference temperatures. In situations where a CRAC unit 114*a* family includes a sensor 120*a* requiring cooling and a sensor 120*b* requiring heating, the sensor 120*a* requiring cooling is considered as the control sensor for that CRAC unit 114*a* family, even if the magnitude of the temperature difference is greater for the sensor 120*b* requiring heating is greater than the magnitude of the temperature difference for the sensor 120*a* requiring cooling. In addition, the control sensors requiring cooling may be designated as requiring cooling and the control sensors requiring heating may be designated as requiring heating at step 618.

By way of example, in the CRAC unit 114*a* family, if the sensor 120*a* has a sensed temperature of 30° C. and a reference temperature of 25° C. and the sensor 120*b* has a sensed temperature of 32° C. and a reference temperature of 25° C., the sensor 120*b* is considered as the control sensor for the CRAC unit 114*a* family. In addition, the magnitude of the temperature difference of the control sensor is +7° C. The sensor 120*b* is considered the control sensor because the sensor 120*b* may have the greatest level of control over the CRAC unit 114*a* since its sensed temperature has the greatest deviation from the reference temperature.

At step 620, it is determined as to whether the control sensors identified at step 618 are the control sensors of multiple CRAC unit 114*a*-114*n* families. For those control sensors that are the control sensors of respective single CRAC unit 114*a*-114*n* families, the heating or cooling designation given to them and the other sensors 120*a*-120*n* in their respective CRAC unit 114*a*-114*n* families at step 618 may be removed at step 622. In addition, the sensors 120*a*-120*n* may be checked at step 624, to determine whether they are all in at least one CRAC unit 114*a*-114*n* family. Should it be determined that at least one of the sensors 120*a*-120*n* is not in a CRAC unit 114*a*-114*n* family, the operational mode 400 and either of operational mode 450 and 470 may be performed to determine the at least one CRAC unit 114*a*-114*n* family of the at least one sensor 120*a*-120*n*. In any regard, at step 607, it may be determined as to whether the operational mode 600 is to continue for those control sensors and other sensors 120*a*-102*n* in the CRAC unit 114*a*-114*n* families 114*a*-114*n* of those control sensors. If it is determined that the operational mode 600 is to continue for those control sensors and other sensors 120*a*-120*n*, the operational mode 600 may be repeated for those control sensors and other sensors 120*a*-120*n* beginning at step 604. If it is determined that the operational mode 600 is to be discontinued at step 607, the operational mode 600 for those control sensors and other sensors 120*a*-120*n* may end as indicated at step 608. The operational mode 600 may also be re-initiated under any of the conditions described with respect to step 604.

For those control sensors identified as the control sensors of multiple CRAC unit 114*a*-114*n* families, it may be determined whether the CRAC units 114*a*-114*n* of the multiple CRAC unit 114*a*-114*n* families are at different setpoints at step 626. In other words, for those CRAC units 114*a*-114*n*, it may be determined whether the differences in supply air temperatures between the CRAC units 114*a*-114*n* exceed a CRAC temperature difference threshold. For those multiple CRAC unit 114*a*-114*n* families having CRAC units 114*a*-114*n* that do not exceed the CRAC temperature difference threshold, steps 622, 624, 607 and 608 may be performed as described above. In one regard, since the CRAC units 114*a*-114*n* are within the CRAC temperature difference threshold, multiple CRAC units 114*a*-114*n* may both be used to control the control sensor. However, if it is determined that the CRAC units 114*a*-114*n* are at different setpoints or outside of the CRAC temperature difference threshold, it may be determined whether the CRAC units 114*a*-114*n* are required to heat or cool the control sensor at step 628.

In addition, at step 628, the control sensor may be assigned to the CRAC unit 114*a* family having the CRAC unit 114*a*, whose supply air temperature is the farthest away from the temperature of the control sensor. That CRAC unit 114*a* family may be considered as the primary family for that control sensor. The other CRAC unit 114*b*-114*n* families to which the control sensor is assigned may be considered as secondary families for that control sensor. More particularly, if the control sensor requires cooling, the CRAC unit 114*a* family having the CRAC unit 114*a* with the highest supply air temperature is selected as the primary family for that control sensor. Alternatively, if the control sensor requires heating, the CRAC unit 114*a* family having the CRAC unit 114*a* with the lowest supply air temperature is selected as the primary family for that control sensor.

If the control sensor requires cooling, all overlapping points having the same sign as the control sensor are removed from the secondary family, as indicated at step 630. More particularly, the sensors 120*a*-120*n* that are in both the primary and secondary families and that have the same sign (for example, requiring either heating or cooling) as the control sensor are removed from the secondary family. In this regard, control over the temperature of the control sensor is given to the CRAC unit 114*a* that has the highest supply air temperature, if that supply air temperature is greater than the temperature of the control sensor. In this regard, the CRAC unit 114*a* having the highest supply air temperature may be able to reduce its supply air temperature. Otherwise, if all of the potential control CRAC units 114*a*-114*n* have supply air temperatures below the control sensor temperature, control is given to the CRAC unit 114 that is closest in temperature to the control sensor temperature. As such, the CRAC unit 114*a* that has the greatest supply temperature may be controlled, when the control sensor is in the cooling mode.

If the control sensor requires heating, which means that no other sensors 120*a*-120*n* in the primary family require cooling, all overlapping points having the opposite sign as the control sensor are removed from the primary family, as indicated at step 632. More particularly, the sensors 120*a*-120*n* that are in both the primary and secondary families and that have the opposite sign as the control sensor are removed from the primary family. In this regard, control over the temperature of the control sensor is given to the CRAC unit 114*a* that has the lowest supply air temperature, if that supply air temperature is less than the temperature of the control sensor. In this regard, the CRAC unit 114*a* may be able to increase its supply air temperature. Otherwise, if all of the potential control CRAC units 114*a*-114*n* have supply temperatures above the control sensor temperature, control is given to the CRAC unit 114*a* that is the closest in temperature to the control sensor. Thus, the CRAC unit 114*a* that has the lowest supply temperature may be controlled, when the control sensor is in the heating mode.

Following step 632, the heating or cooling designation given to the sensors 120*a*-120*n* at step 616 may be removed at step 622. In addition, the sensors 120*a*-120*n* may be checked at step 624, to determine whether they are all in at least one CRAC unit 114*a*-114*n* family. Should it be determined that at least one of the sensors 120*a*-120*n* is not in a CRAC unit 114*a*-114*n* family, the operational mode 400 and either of operational mode 450 and 470 may be performed to determine the at least one CRAC unit 114*a*-114*n* family of the at least one sensor 120*a*-120*n*. In addition, or alternatively, sensors 120*a*-120*n* that are not in any of the CRAC unit 114*a*-114*n* families may be removed from consideration from the operational mode 400 or the cooling infrastructure may be re-arranged, such as by moving vent tiles 118, to bring the sensors 120a-120n within at least one of the CRAC unit 114a-114n families. In any regard, steps 607 and 608 may be performed as described above.

Control of Actuators

The control of the primary actuators 114a-n based on the commissioning of the sensors 120a-n, as disclosed in a co-pending and commonly assigned U.S. patent application as identified from its U.S. Patent Application Publication No. 20060214014, entitled "TEMPERATURE CONTROL USING A SENSOR NETWORK," is described below with reference to FIGS. 7-8.

FIG. 7 illustrates a flow diagram of a method 700 for controlling an environmental condition using a sensor network, according to one embodiment. For illustrative purposes only and not to be limiting thereof, the operation mode 300 is discussed in the context of the block diagram 200 illustrated in FIG. 2.

The method 700 may be implemented to control the temperature of the airflow supplied to the sensors 120a-120n by the primary actuators 114a-114n. In the method 700, the controller 130 may commission the sensors 120a-120n of a network of sensors at step 702. The controller 130 may also select one of a plurality of control schemes for operating a primary actuator 114a-114n configured to vary temperatures of the sensors 120a-120n at step 704. The selection of the control scheme may be based upon energy utilization requirements of the plurality of control schemes. In addition, the controller 130 may implement the selected one of the plurality of control schemes to vary the temperatures detected by the sensors 120a-120n at step 706. A more detailed description of the steps outlined in the method 700 is provided below with respect to the method 800.

Figure 8:
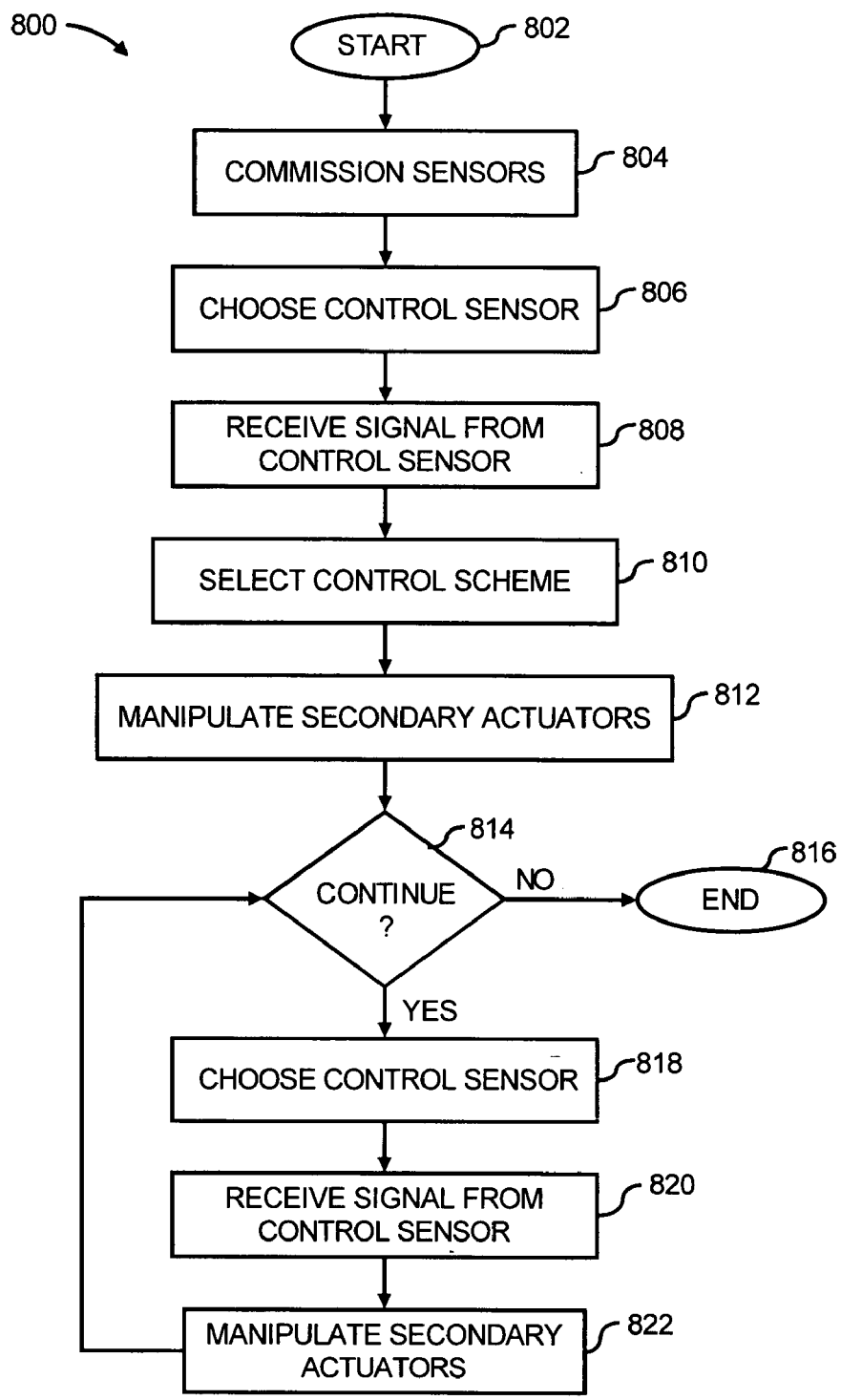
FIG. 8 illustrates a flow diagram of a method for controlling environmental conditions at sensor locations, according to an embodiment of the invention.

With particular reference now to FIG. 8, there is shown a flow diagram of a method 800 for controlling environmental conditions at the sensor 120a-120n locations, according to one embodiment. For illustrative purposes only and not to be limiting thereof, the operation mode 300 is discussed in the context of the block diagram 200 illustrated in FIG. 2.

The method 800 may be implemented to control primary actuators (CRAC units) 114a-114n to thereby control environmental conditions at the sensor 120a-120n locations. For example, the primary actuators 114a-114n may be controlled as disclosed below to control at least one of temperature, humidity, and pressure at the sensor 120a-120n locations.

The method 800 may be initiated at step 802 in response to any of a number of stimuli or conditions. For example, the method 800 may be initiated with activation of components, such as, the CRAC units 114a-114n. In addition, or alternatively, the method 800 may be manually initiated or the controller 130 may be programmed to initiate the method 800 at various times, for a set duration of time, substantially continuously, etc.

Once initiated, the controller 130 may implement the sensor commissioning module 214 to commission the sensors 120a-120n at step 804. More particularly, the sensors 120a-120n may be assigned to primary actuator 114a-114n families according to, for example, the level of influence the primary actuators 114a-114n have over the sensors 120a-120n. In addition, a sensor 120a may be considered as being in the family of a primary actuator 114a if the level of influence of that actuator 114a over the sensor 120a exceeds a predefined threshold. In addition, if a sensor 120a is assigned to multiple primary actuator 114a-114n families, a filtering process may be implemented to assign the sensor 120a to the primary actuator 114a that has the greatest level of influence over the sensor 120a. The filtering process may also be implemented to keep the sensor in multiple primary actuator 114a-114n families if the influence levels of the primary actuators 114a-114n are within predefined thresholds. An examples of a suitable commissioning process and a suitable filtering process is as described earlier.

At step 806, for each primary actuator 114a-114n family, the controller 130 may implement the control sensor selection module 216 to choose the control sensor 120n. As described above, the control sensor 120n may be defined as the sensor 120a-120n with the largest positive temperature difference from a setpoint temperature in each primary actuator 114a-114n family. If all of the sensors 120a-120n have negative temperature differences from the at least one setpoint, then the control sensor 120n may be defined as the sensor 120a-120n with the largest negative difference from the setpoint temperature. The setpoint used to determine the control sensor 120n may also vary between the sensors 120a-120n and is thus not required to be identical for all of the sensors 120a-120n.

In general, the temperatures of the control sensors 120a-120n are used to control the primary actuators 114a-114n of the families to which the control sensors 1201a-120n belong. More particularly, the following steps may be performed to vary the setpoints of the secondary actuators 222 and 224 to thereby bring the temperatures of the control sensors 120a-120n to within desired temperature ranges. The desired temperature ranges, in this case, may generally represent acceptable levels of error in controlling the temperatures of the sensors 120a-120n. Thus, for example, the desired temperature ranges may be larger if a higher level of error is acceptable.

At step 808, the controller 130 may receive signals from the control sensors 120a-120n of the primary actuator 114a-114n families. The signals are generally control signals for operating respective primary actuators 114a-114n. The signals are generated according to the levels of error between measured temperatures and predefined temperatures. More particularly, if the temperature difference is relatively small, the signal sent to the controller 130 is also relatively small. Alternatively, if the temperature difference is relatively large, the signal sent to the controller 130 is also relatively large. The controller 130, in this case, may include a proportional, integral (PI) controller or a proportional, integral, derivative (PID) controller, and may control operations of the primary actuators 114a-114n (to output desired supply air temperature or SAT setpoints) based upon the magnitudes of the control signals received from the control sensors 120a-120n as described in greater detail herein below with respect to step 812. In addition, each of the primary actuators 114a-114n may include respective PI, PID, other suitable controllers.

For each primary actuator 114a-114n family having a control sensor 120a-120n that transmits a control signal indicating an error, the controller 130 may implement one of many possible control schemes to manipulate the secondary actuators 222 and 224, as indicated at step 810. As described above with respect to the control system 202, one of the secondary actuators 222 may comprise a variable frequency drive (VFD) for controlling an airflow volume varying device, such as a blower or fan. The other secondary actuator 224 may comprise a device for controlling the temperature of the cooled air supplied by the primary actuators 114a-114n, and may depend upon the type of primary actuator 114a-114n in which the secondary actuator 224 is located. Additionally, each primary actuator 114a-114n may include another secondary actuator (not shown) for humidity control, such as a humidifier, a de-humidifier, or the like.

The possible control schemes for manipulating the secondary actuators 222 and 224 involve a linkage of one of the secondary actuators 222 (VFD's) to the supply air temperature (SAT) setpoints of the primary actuators 114a-114n throughout a range of control. The range of control may be defined as a predefined range of supply air temperatures and VFD settings within which the primary actuators 114a-114n may operate. In this regard, the range of control may be based upon levels that are known to provide adequate levels of cooling airflow at adequate temperatures. In any regard, the linkage between the VFD setpoints (secondary actuator 222) and the SAT setpoints (secondary actuator 224) may be described through the following equation:

$$VFD = VFD_{max} + \gamma(SAT_{min} - SAT).$$ Equation (5)

In this equation, $VFD_{max}$ is the maximum allowable VFD setpoint, $SAT_{min}$ is the minimum allowable supply air temperature, and $\gamma$ is $(VFD_{max} \gamma VFD_{min})/(SAT_{max} - SAT_{min})$. $VFD_{min}$ is the minimum allowable VFD setpoint and $SAT_{max}$ is the maximum allowable supply air temperature.

The control schemes may be varied as a function of the SAT setpoints output by a controller, such as a PI or PID controller, in the controller 130 as described above. The specific functionality is dependent on the actuator type of the primary actuators 114a-114n, as further elaborated in U.S. Patent Application Publication No. 20060214014.

Visualization

A visualization tool for analyzing and visualizing thermal profiles in a selected environment, such as the data center 100, as disclosed in a co-pending and commonly assigned U.S. patent application Ser. No. 11/699,402, entitled "COMPUTERIZED TOOL FOR ASSESSIGN CONDITIONS IN A ROOM," is described below with reference to FIGS. 9-13. This visualization tool provides users with a monitoring tool to instantiate any implemented environmental control for a selected environment. Thus, for example, a system administrator of the data center 100 may employ this visualization tool to instantiate the aforementioned control schemes based on the commissioning of the sensors and optimize placement of equipment in such a data center for environmental management of the data center.

Figure 9:
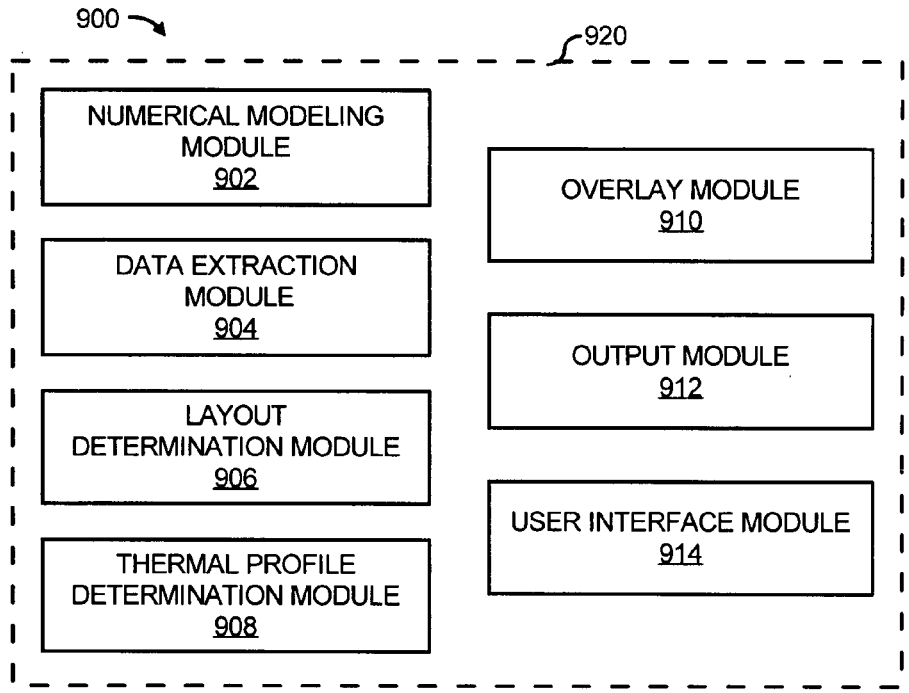
FIG. 9 shows a block diagram of a computerized tool configured to assess and visualize thermal performance in a room, according to an embodiment of the invention.

With respect to FIG. 9, there is shown a block diagram of a computerized tool 900 configured to assess and visualize a thermal profile in a room, according to an example. It should be understood that the following description of the computerized tool 900 is but one manner of a variety of different manners in which the computerized tool 900 may be configured. In addition, it should be understood that the computerized tool 900 may include additional modules and that some of the modules described herein may be removed and/or modified without departing from a scope of the computerized tool 900.

Generally speaking, the computerized tool 900 is configured to analyze a thermal profile in a room containing equipment, such as racks and electronic devices, and fluid moving devices, such as heat exchangers, air conditioning units, chiller units, and other environmental actuators (e.g., 114a-n in FIG. 1). In analyzing the thermal profile, the computerized tool 900 is configured to compute a relatively high level metric that quantifies a phenomena within the room and to automatically overlay the relatively high level metric on a layout of the room.

According to a first example, the relatively high level metric may comprise a supply heat index (SHI), which is an index of performance that quantifies the amount of re-circulation occurring at various locations in the room. A more detailed description of SHI is presented in U.S. Pat. No. 7,051,946 to Cullen Bash et al., the disclosure of which is hereby incorporated by reference in its entirety.

As discussed in U.S. Pat. No. 7,051,946, SHI may be defined as a measure of the infiltration of heated fluid into the cooling fluid supplied by fluid moving devices 1104a-n (FIG. 3A) and may be determined for fluid flow through an object, such as a rack 306a (FIG. 3A), according to the following equation:

$$SHI = \frac{T_i - T_{ref}}{T_o - T_{ref}}.$$ Equation (6)

In Equation (6), $T_i$ represents the temperature at an inlet of the object, $T_o$ represents the temperature at an outlet of the object, and $T_{ref}$ represents the temperature of fluid flow supplied to the inlet of the object, such as by a fluid moving device 302a (FIG. 3A). As discussed herein below, the temperatures used to determine SHI may be calculated through use of numerical modeling.

As another example of a thermal profile, the relatively high level metric may comprise a thermal correlation index (TCI) or correlation coefficient (C) as described earlier in Equation (1). As discussed in those documents, TCI is a measure of the relative level of influence a fluid moving device has over a particular area in a room. Thus, for instance, the higher the TCI value at a particular location for a fluid moving device, the greater the influence the fluid moving device has over that location.

As a further example of a thermal profile, the relatively high level metric may comprise a local workload placement index (LWPI), which is generally a measure of the efficiency with which cooling resources may be distributed to a device. A more detailed description of LWPI is presented in the Ser. No. 11/590,525 application for patent, the entire disclosure of which is hereby incorporated by reference in its entirety.

As discussed in that application for patent, the LWPI may be determined through a function in which the LWPI increases with an increase in one or both of the thermal management margin and the fluid moving device margin and a decrease in the recirculation level. In addition, the LWPI's for each of a plurality of electronic devices (i) may be calculated through a function of one or more of $(T_{set}-T_{in})_i$, $(T_{SAT}-T_{SAT,min})_j$, $TCI_j$, and $(T_{in}-T_{SAT})_j$, where $T_{set}$ is a setpoint temperature of a fluid moving device 302a (FIG. 3A) (corresponding to the variable SAT noted earlier), $T_{in}$ is the inlet temperature of the electronic device (i), $T_{SAT}$ is the supply fluid temperature, and $T_{SAT,min}$ is the minimum supply fluid temperature (corresponding to the variable $SAT_{min}$). Also, $TCI_j$ corresponds to $C_j$ as noted earlier.

By way of particular example and not of limitation, the cooling efficiency or workload placement efficiency (LWPI) of a particular electronic device (i) may be calculated from the following equation:

$$LWPI_i = \frac{(T_{set} - T_{in})_i + \left[(T_{SAT} - T_{SAT,min})_j \cdot TCI_j\right]_i}{(T_{in} - T_{SAT})_i}.$$ Equation (7)

According to an example, the computerized tool 900 may visually display the relationships between the thermal profile and the layout for a given room. The visual display of these relationships may be created in a two-dimensional or a three-dimensional setting and may be provided at various heights with respect to the room. The visual display may be used, for instance, to optimize the placement of equipment in a data center, to investigate cooling system failure scenarios, to insure proper cooling redundancies are in place, etc.

As shown in FIG. 9, the computerized tool 900 includes a number of modules 902-914, each configured to perform one or more functions. The modules 902-914 may comprise software configured to be invoked or implemented by a computing device, hardware components configured to perform the one or more functions, or combinations thereof. By way of example, one or more of the modules 902-914 may comprise computer chips configured and programmed to perform the functions described below.

In another of the examples discussed above, the computerized tool 900 comprises a hardware device, such as, a computing device. In this example, the computerized tool 900 may comprise a personal computer, a laptop computer, a portable digital assistant, or other type of device capable of performing computing functions. In addition, one or more of the modules 902-914 may comprise hardware components configured to perform the one or more functions. In addition, or alternatively, one or more of the modules 902-914 may comprise software stored on the hardware components.

In addition, the computerized tool 900 may be located remotely and may be accessed and implemented over a network, such as, an intranet, the Internet, etc.

Figure 10:
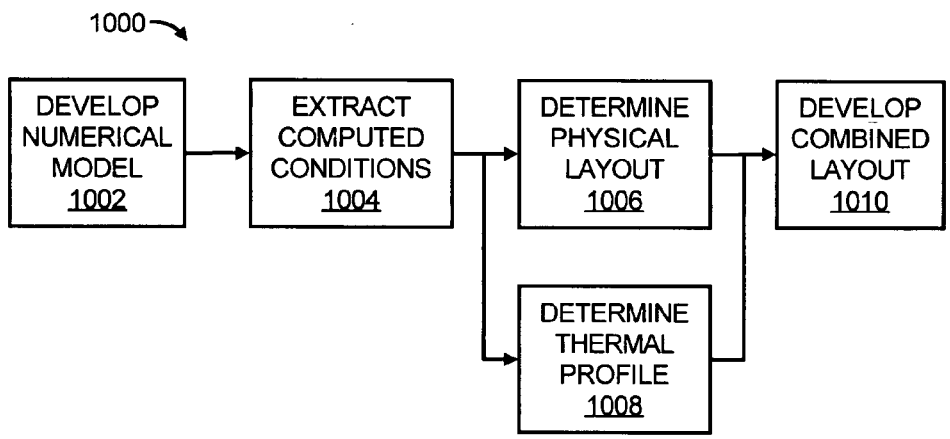
FIG. 10 shows a flow diagram of a method for assessing a thermal profile with respect to equipment housed in a room, according to an embodiment of the invention.

The operations performed by the modules 902-914 will be described in accordance with both of these examples and with regard to the flow diagram depicted in FIG. 10. FIG. 10, more particularly, depicts a flow diagram of a method 200 for analyzing a thermal profile with respect to equipment housed in a room, according to an example. It should be understood that the following description of the method 1000 is but one manner of a variety of different manners in which such a method 1000 may be implemented. In addition, it should be understood that the method 1000 may include additional steps and that some of the steps described herein may be removed and/or modified without departing from a scope of the method 1000.

At step 1002, a numerical model of environmental conditions in the room may be developed. The numerical model may be developed based upon information pertaining to the room, such as, the room layout, the equipment housed in the room, the locations and output profiles of fluid moving devices (e.g., as obtained from the commissioning of the sensors discussed earlier), as well as other objects or obstructions in the room. In one example, the numerical modeling module 902 may comprise software or algorithms configured to develop the numerical model. In this example, the room information may be input into the numerical modeling module 902 and the numerical modeling module 902 may compute the environmental conditions in the room based upon the inputted information.

In another example, the numerical modeling module 902 may be configured to interface with an outside numerical modeling program configured to develop the numerical model. An example of a suitable numerical modeling program is a computational fluid dynamics program, such as, FLOVENT, available from Flomerics Inc., located in Marlborough, Mass. In this example, the numerical modeling module 902 may be configured to provide the outside numerical modeling program with the room information and to receive the numerical model computed by the outside numerical modeling program.

In either example, the environmental conditions may include, for instance, pressure levels, temperature levels, fluid flow velocity levels, humidity levels, etc., at various locations or throughout the room. The environmental conditions may also be calculated in two or three dimensions with respect to the room.

At step 1004, the data extraction module 904 may extract some or all of the environmental conditions computed from the numerical model developed at step 1002. In various examples, the data extraction module 904 may form part of the numerical modeling module 902 and may thus be configured to model the conditions at step 1002. In any regard, the layout determination module 906 may employ the environmental condition information to calculate a layout of the room, as indicated at step 1006. For instance, from the environmental condition information, the layout determination module 906 may determine locations in the room having predetermined environmental condition levels and may determine that one or more objects exist at those locations. For instance, the layout determination module 906 may consider those locations in the room having zero or nearly zero environmental condition levels, such as, pressure, humidity, etc., as including one or more objects.

By way of particular example, the environmental condition extracted from the numerical model may comprise the pressure level distribution in the room. In this example, for instance, the layout determination module 906 may determine the pressure level distribution at a height in the room where objects, such as racks, fluid moving devices, etc., are known to be located. The layout determination module 906 may analyze the pressure level distribution at that selected height to find areas of zero or nearly zero pressure, which are considered to correlate with the locations of the objects. The layout determination module 906 may plot the calculated locations of the objects in a chart to thereby depict the layout of the room. Various manners in which the room layout may be constructed from the environmental condition distribution calculation are described in greater detail herein below.

Another of the conditions extracted may comprise the temperature level distribution, which the thermal profile determination module 908 employs in determining a thermal profile of the room, as indicated at step 1008. The thermal profile determination module 908 may, more particularly, use the temperatures at various heights in the room resulting from incremental changes in the cooling fluid supplied by the fluid moving devices to determine one or more thermal profiles in the room. In one example, the thermal profile determination module 908 may calculate the TCI of each of the fluid moving devices with respect to various areas in the room based upon the temperatures. Alternatively, the TCI values are available from the aforementioned commissioning of the sensors. In another example, the thermal profile determination module 908 may calculate the SHI at various locations in the room based upon the temperatures. Again, various manners in which the thermal profile determination module 908 operates to determine the thermal profile in a room are discussed in greater detail herein below.

At step 1010, the overlay module 910 may overlay one or more of the thermal profiles on the physical layout of the room determined at step 1006 to develop a combined layout. At steps 1006 and 1008, the room layout and the thermal profiles may be developed to have the same scale. As such, the thermal profiles may be scaled appropriately with the room layout.

Although the thermal profile determined at step 1008 has been described as being overlaid on the physical layout of the room determined at step 1006, it should be understood that in various instances, the thermal profile may be overlaid on other differently obtained room layouts without departing from a scope of the method 1000. In other words, the thermal profile may be overlaid on a graphical representation of an existing room layout, that is, a room layout that has not been determined as indicated at step 1006. However, in various other instances, it may be desirable to determine the physical layout of the room at step 1006 and to overlay the thermal profile on the determined physical layout because they may have the same scaling, which may reduce the amount of time a effort required of users in visualizing the thermal profile with respect to the room layout.

In any regard, the output module 912 may store the combined layout in a database. In addition, or alternatively, the output module 912 may display or print the combined layout to thus provide users with a two or three dimensional image of the thermal profiles associated with one or more fluid moving devices in relation to room layout.

The user interface module 914 may provide users with the ability to modify or manipulate the inputs into the numerical modeling module 902 or to the outputs generated by the output module 912. In one example, users may implement the user interface module 914 to determine the thermal profile resulting from various fluid moving device placements, various fluid moving device failures, various rack placements, etc. In another example, the user interface module 914 may provide users with the ability to modify the combined layout visualization in various respects.

Figure 11A:
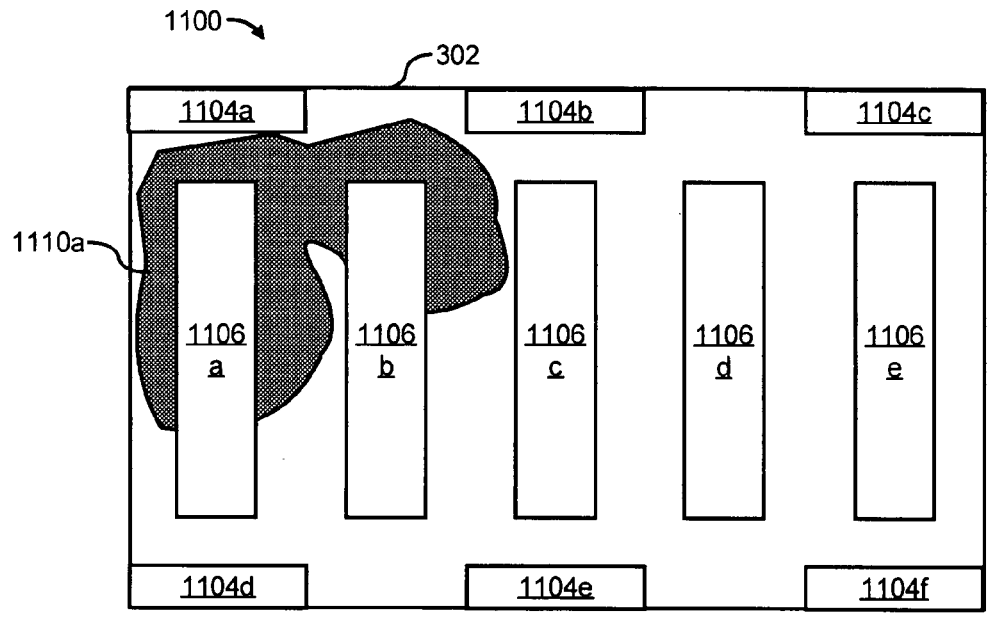
FIG. 11A illustrates an example of a room layout overlaid with a thermal profile, according to an embodiment of the invention.
Figure 11B:
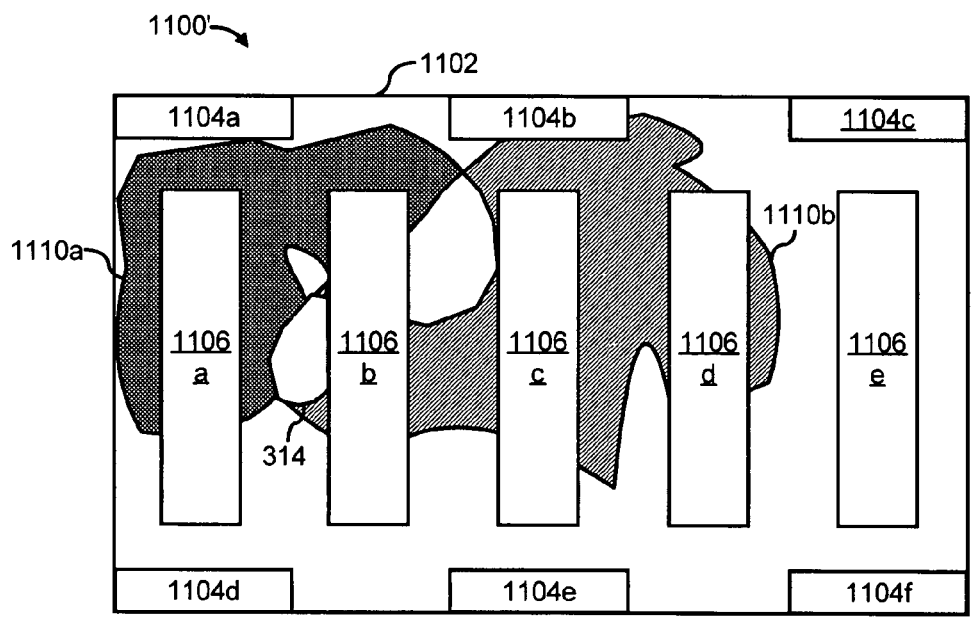
FIG. 11B illustrates an example of a room layout overlaid with multiple thermal profiles, according to an embodiment of the invention.

An example of a combined layout 1100, 1100' developed by the computerized tool 900 is depicted in FIGS. 11A-B. More particularly, FIGS. 11A-B respectively show examples of how thermal profiles 1110a-1110n may be depicted in a room 1102 containing fluid moving devices 1104a-n and racks 1106a-n, where "n" is an integer equal to or greater than one. Only two thermal profiles 1110a and 1110b, six fluid moving devices 1104a-1104f, and six racks 1106a-1106f are depicted in FIGS. 11A and 11B for illustrative purposes and should thus not be construed as limiting the combined layout 1100, 1100' output in any respect. Although not shown, the combined layouts 1100, 1100' may also include labels that identify the various objects contained therein.

With reference first to the combined layout 1100 in FIG. 11A, only the thermal profile 1110a, such as, the thermal correlation index (TCI), associated with one of the fluid moving devices 1104a is shown therein. One purpose of the combined layout 1100 in FIG. 11A is to clearly show the level of influence over particular areas, as denoted by TCI, of the fluid moving device 1104a. Similar types of figures may be prepared for each of the remaining fluid moving devices 1104b-1104f to depict their relative levels of influence over particular areas in the room 1102.

In addition, the thermal profiles 1110a-1110n associated with two or more of the fluid moving devices 1104a-1104f may also be depicted together, as shown in FIG. 11B. The combined layout 1100' in FIG. 11B more particularly shows that there may be areas of overlap 1114 among two or more TCIs 1110a-1110n. As such, the combined layout 1100' may display which of the fluid moving devices 1104a-1104n provide cooling fluid to which areas in the room 1102. This information may be employed to ensure that there are sufficient redundancies to maintain temperatures within predetermined levels should one or more of the fluid moving devices 1104a-1104n fail. In one example, critical equipment may be placed in areas of overlap 1114 to substantially ensure that the critical equipment receives cooling fluid in the event that one of the fluid moving devices 1104a-1104n fails. This information may also be employed to determine whether any area in the room 1102 is receiving excessive amounts of cooling fluid from a plurality of fluid moving devices 1104a-1104n and may thus be used to determine optimal placement of the fluid moving devices 1104a-1104n.

As shown in FIGS. 11A and 11B, the combined layouts 1100, 1100' may be configured to display TCI 1110a-1110n levels that exceed a predetermined threshold level. Thus, even though the fluid moving device 1104a may have influence over areas other than the TCI 1110a, only the TCI 1110a exceeding the predetermined threshold level is depicted in the combined layouts 1100, 1100' to thereby provide users with the ability to control the data displayed in the combined layouts 1100, 1100'. In addition, or alternatively, the combined layouts 1100, 1100' may display varying levels of TCI for each of the fluid moving devices 1104a-1104n. Thus, for instance, the TCIs 1110a-1110n may comprise different colors or different shadings of colors that substantially correspond to different TCI levels.

Figure 12:
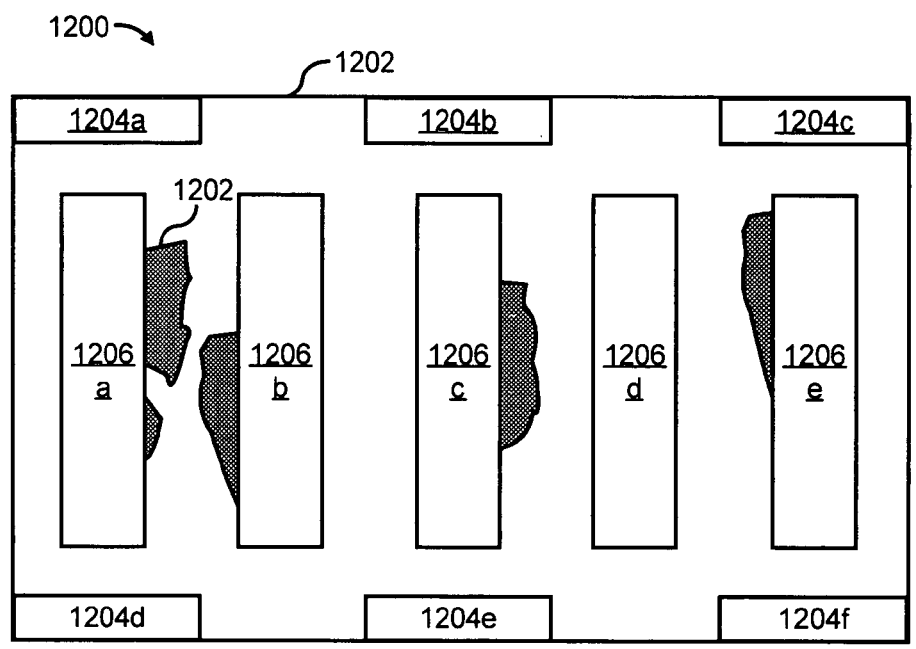
FIG. 12 illustrates an example of a room layout overlaid with a thermal profile, according to another embodiment of the invention.

Another example of a combined layout 1200 developed by the computerized tool 900 is depicted in FIG. 12. FIG. 12 depicts all of the same features as FIGS. 11A and 11B, including the room 1202, the fluid moving devices 1104a-1104n, and the racks 1106a-1106n. The combined layout 1200 in FIG. 12 differs from the combined layouts 1100 and 1100' because it displays a different type of thermal profile 1202. In the combined layout 1200, the computerized tool 900 is configured to depict thermal profiles, such as, SHI and LWPI levels throughout the room 1100.

The combined layout 1200 may be configured to display SHI or LWPI 1202 levels that exceed a predetermined threshold level. Thus, for instance, even though there may be an appreciable amount of SHI in areas other than those illustrated in the layout 1200, those areas are not illustrated because they do not exceed the predetermined threshold level. In addition, or alternatively, the combined layout 400 may display varying levels of SHI or LWPI 1202 by displaying the varying levels using different colors or different shadings of colors that substantially correspond to different SHI or LWPI levels.

With reference now to FIGS. 13A-13E, there is collectively shown a flow diagram of a method 1300 for analyzing and visualizing a thermal profile of a room, such as, the room 1102 depicted in FIGS. 11A, 11B, and 12. It should be apparent to those of ordinary skill in the art that the method 1300 represents a generalized illustration and that other steps may be added or existing steps may be removed, modified or rearranged without departing from a scope of the method 1300.

The description of the method 1300 is made with reference to the computerized tool 900 illustrated in FIG. 9, and thus makes reference to the elements cited therein. It should, however, be understood that the method 13 is not limited to the elements set forth in the computerized tool 900. Instead, it should be understood that the method 1300 may be practiced by a computerized tool having a different configuration than that set forth in FIG. 9. In addition, the method 13 includes some of the steps outlined in the method 1000 depicted in FIG. 10. The method 13 differs from the method 200 in that the steps contained in the method 13 describe, in greater detail, the steps contained in the method 1000. For instance, FIGS. 13A-B include steps for developing a numerical model (step 1002) and for extracting computed conditions (step 1004), FIGS. 13C-D include steps for determining the physical layout (step 1006) and the thermal profile (step 1008) of the room 1102, and FIG. 13E includes steps for developing the combined layout (step 1010), as well as steps for displaying the combined layout.

Figure 13A:
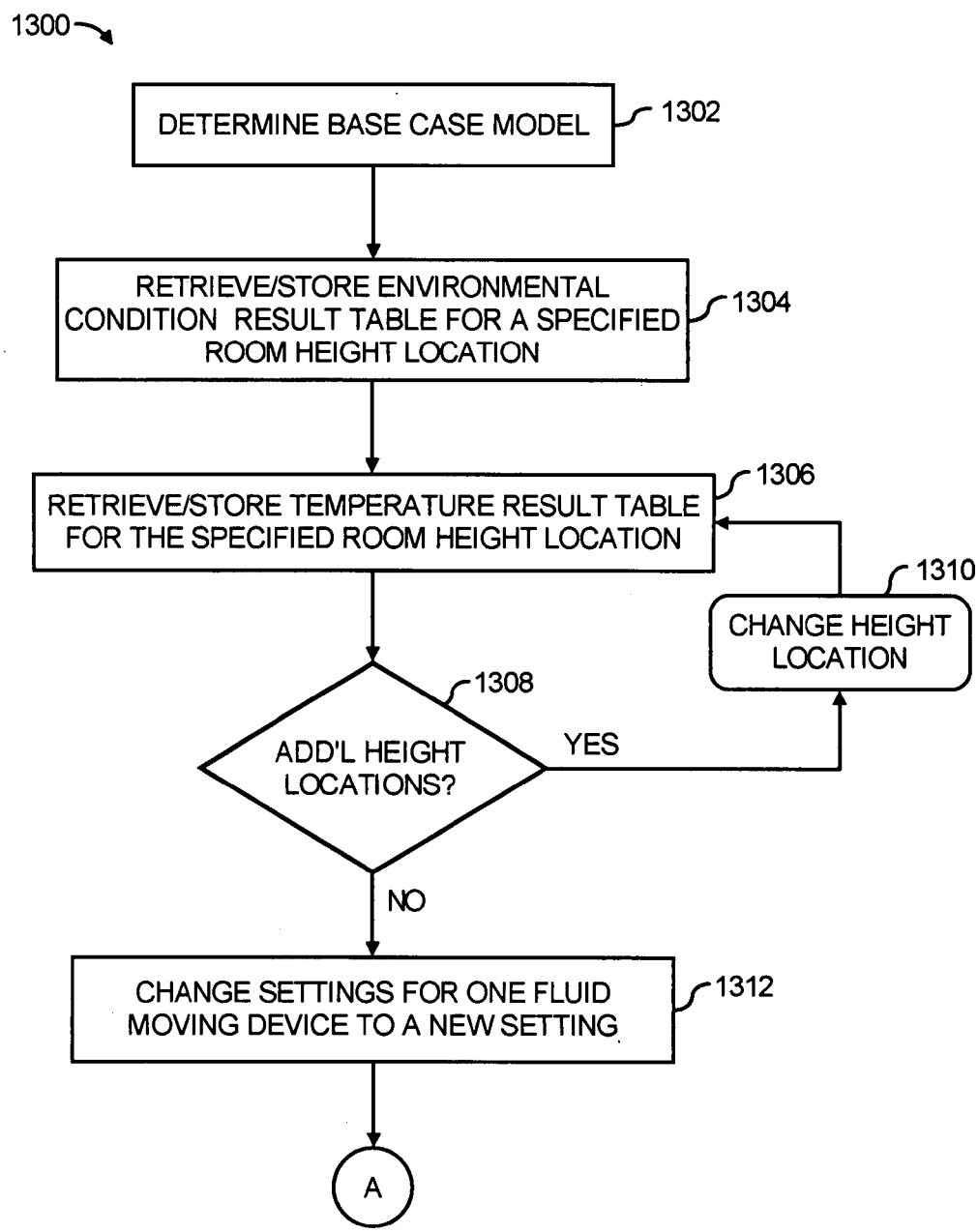
FIGS. 13A-13E, collectively, show a flow diagram of a method for analyzing and visualizing a thermal profile of a room, according to an embodiment of the invention.
Figure 13B:
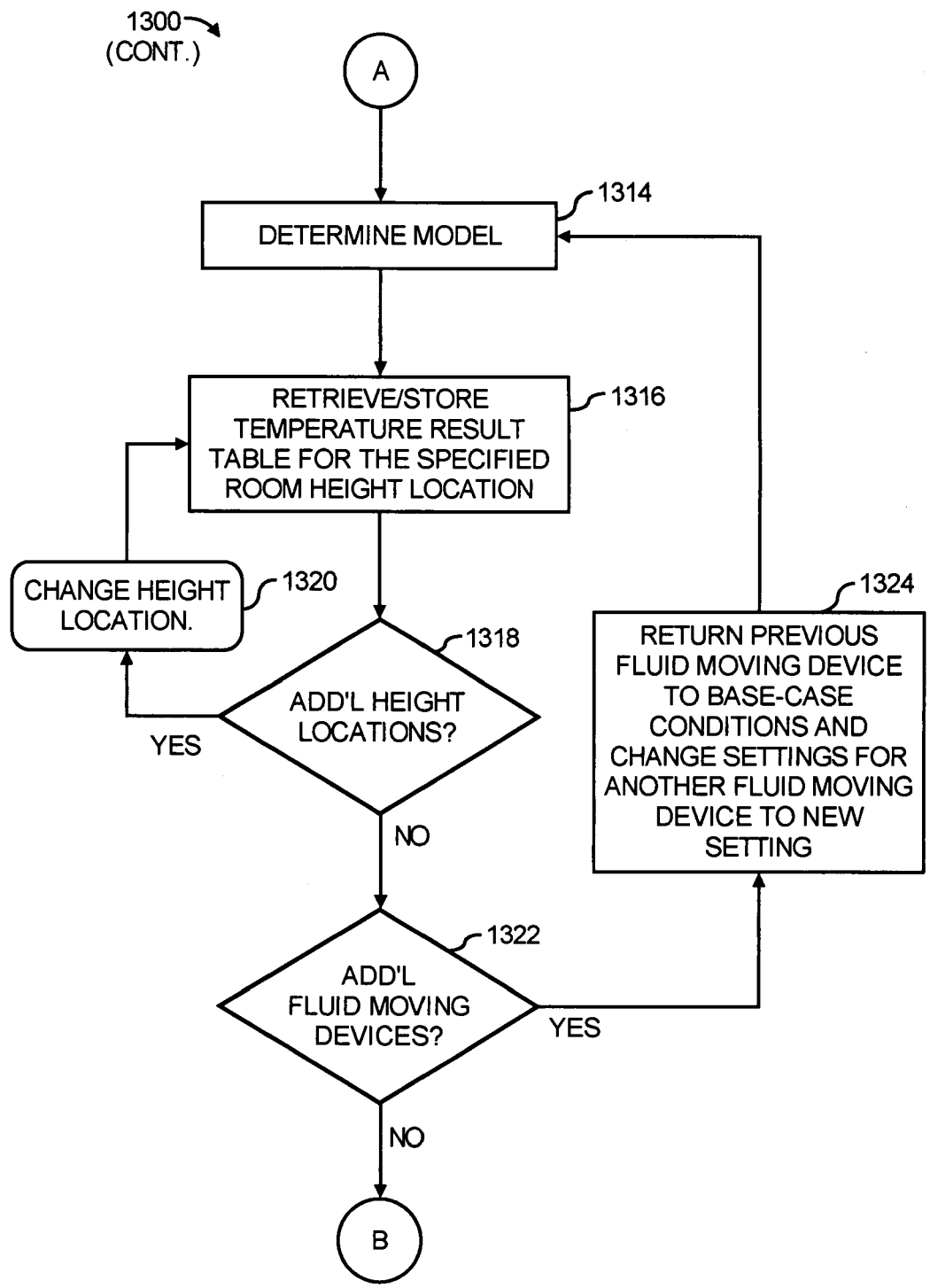

With reference first to FIGS. 13A-B, at step 1302, the computerized tool 900 may determine a base case model of conditions in the room 1102 for a given set of settings for the fluid moving devices 1104a-1104n. Alternatively, the computerized tool 900 may invoke an outside numerical modeling program, such as FLOVENT, to run the base case model. In either case, by way of example, the fluid moving devices 1104a-1104n may be set to an initial setting in the numerical modeling program in determining the base case model. The initial setting may comprise, for instance, 70% fluid flow capacity and 72° F. supply temperature.

The base case model generally provides information pertaining to the environmental condition levels calculated at a specified height in the room 1102 as well as the temperatures calculated at the specified height, or the height where the temperature sensors (e.g., 120a-n in FIG. 1) are installed. The specified height may be selected to substantially ensure that substantially all of the objects, such as, fluid moving devices 1104a-1104n, racks 1106a-1106n, etc., contained in the room 1102 are located at the specified height. The information may be stored in an environmental condition result table and a temperature result table for the specified height. At step 1304, the computerized tool 900 may store the environmental condition result table for the specified height. Alternatively, the computerized tool 900 may retrieve and store the environmental condition result table for the specified height from the outside numerical modeling program.

As described in greater detail herein below, the information contained in the environmental condition result table may be employed to calculate a physical layout of the room 1102.

At step 1306, the computerized tool 900 may store the temperature result table for the specified height. Alternatively, the computerized tool 900 may retrieve and store the temperature result table for the specified height from the outside numerical modeling program. In either case, the computerized tool 900 may save the temperature result table as a "csv" file.

At step 1308, a determination as to whether a temperature result table for a height different than the specified room height is to be retrieved/stored may be made. A decision to retrieve/store the temperature result table for an additional height location may be made in situations where the temperatures at additional heights in the room are desired or necessary. If a determination is made to retrieve/store the temperature result table at the additional height location, the computerized tool 900 may change the height location as indicated at step 1310. The computerized tool 900 may additionally retrieve/store the temperature result table for the additional height, as indicated at step 1306. Steps 1306-1310 may be repeated for any additional height locations as desired or as is necessary.

Following a "no" condition at step 1308, the computerized tool 900 may change the settings for one of the fluid moving devices 304a to a different setting, as indicated at step 1312. By way of example, the fluid moving device 304a may be set to 100% fluid flow capacity and 60° F. supply temperature. In addition, at step 1314 (FIG. 5B), the numerical modeling module 902 may determine a model of conditions in the room 1102 resulting from the new fluid moving device 1104a setting. Alternatively, the computerized tool 900 may invoke an outside numerical modeling program to determine the model at the new fluid moving device 304a setting.

At step 1316, the computerized tool 900 may store the temperature result table for a specified height. Alternatively, the computerized tool 900 may retrieve and store the temperature result table for a specified height from the outside numerical modeling program. In either case, the computerized tool 900 may save the temperature result table as a "csv" file. In addition, similarly to steps 506-510 (FIG. 5A), the temperature result table at additional height locations may be retrieved/stored, as indicated at steps 516-520. Moreover Steps 516-520 may be repeated for any additional height locations as desired or as is necessary.

Following a "no" condition at step 1318, a determination as to whether the temperature results for additional fluid moving devices 1104b-n are to be determined may be made at step 1322. An election to obtain temperature results for additional fluid moving devices may be made, for instance, if it is determined that conditions at various settings for each of remaining fluid moving devices 1104b-n has not been determined. In response to a "yes" condition at step 1322, the computerized tool 900 may return the settings for the fluid moving device 304a back to the initial setting (step 1302) and may change the settings for another one of the fluid moving devices 304b to a different setting, as indicated at step 1324. By way of example, the fluid moving device 304b may be set to 100% fluid flow capacity and 60° F. supply temperature. In addition, steps 514-522 may be repeated for the remaining fluid moving devices 1104b-n.

As described in greater detail herein below, the information contained in the temperature results tables and the various fluid moving devices 1104a-1104n settings may be used to calculate various thermal profiles in the room 1102. This information may, for instance, be used to calculate SHIs at various locations throughout the room 1102 through implementation of Equation (6). In addition, or alternatively, the collected temperature information may be used to calculate the TCIs between the fluid moving devices 1104a-n and various locations throughout the room 1102 through implementation of Equation (1). Moreover, the collected temperature information may be used to calculate the LWPIs of one or more electronic devices through implementation of Equation (7).

Figure 13C:
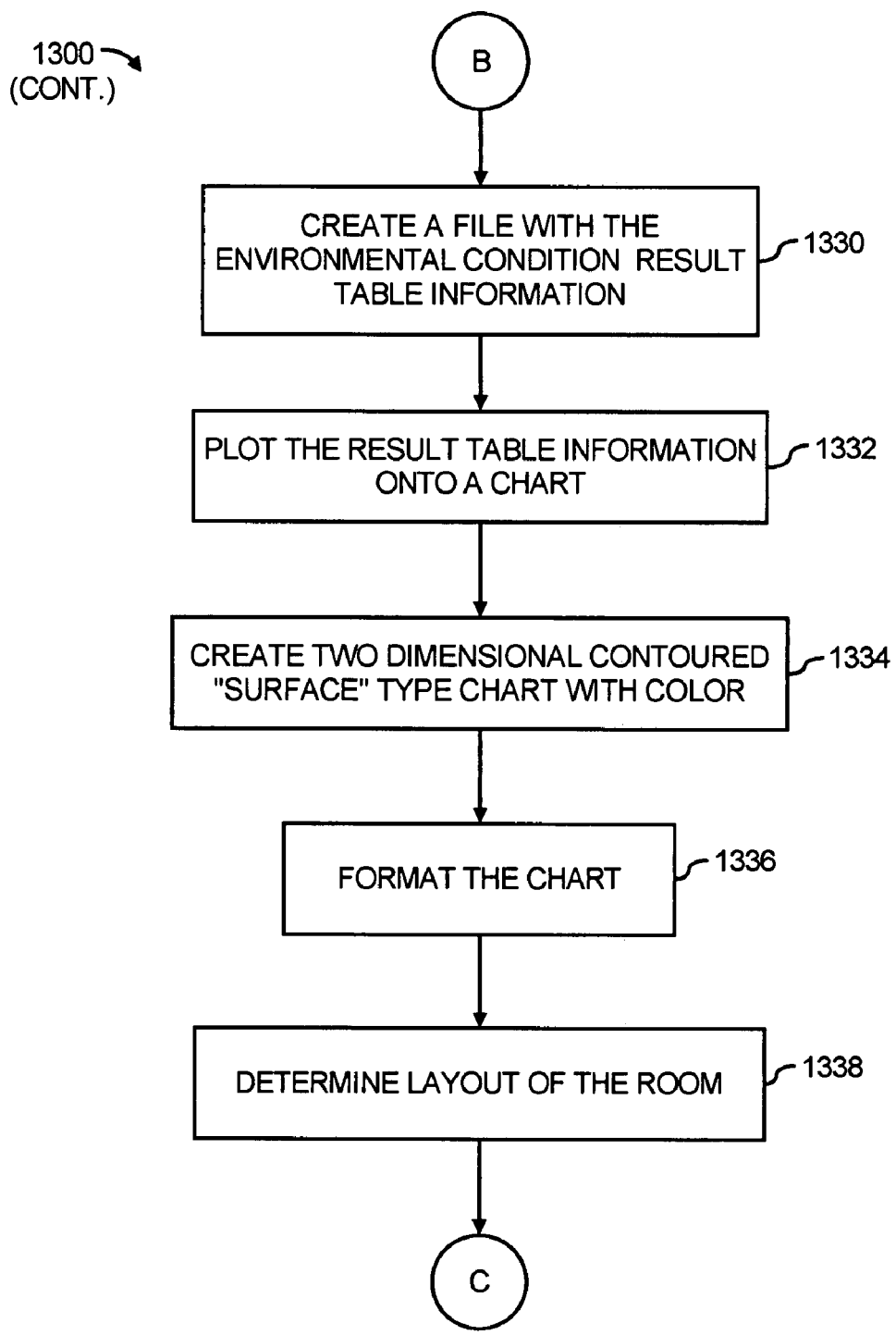

With reference now to FIG. 13C, there are shown steps for determining the physical layout of the room 1102 (step 1006) from the information obtained from the steps outlined in FIGS. 5A and 5B. More particularly, at step 1330 the computerized tool 900 may utilize the information contained in the environmental condition result table stored at step 1304 (FIG. 13A) to create a file, such as a spreadsheet file with the environmental condition information. According to an example, the computerized tool 900 may communicate with a spreadsheet program, such as, MS EXCEL, available from Microsoft Corporation of Redmond, Seattle. In this example, the computerized tool 900 may store the environmental condition result table information in the spreadsheet program.

In any regard, the computerized tool 900 or the spreadsheet program may plot the environmental condition result table information onto a chart, as indicated at step 1332. In situations where the spreadsheet program is implemented, the computerized tool 900 may select the environmental condition data contained in the spreadsheet and may invoke or otherwise activate a chart creating program, such as a chart wizard, to create the chart.

According to an example, the chart may comprise a "surface" type of chart having a two dimensional contour and having color, as indicated at step 1334. At step 1336, the chart may be formatted to, for instance, remove tick marks and a legend box on the chart to therefore obtain a similar layout to that of the room 1102 depicted in FIG. 11A. More particularly, the chart may have a fairly rough outline of the room 1102 exterior along with outlines of the fluid moving devices 1104a-f and the racks 1106a-e. In one regard, the fluid moving devices 1104a-f and the racks 1106a-e would be distinguishable in the chart because those locations have been computed to have zero or very nearly zero condition level. As such, the computerized tool 900 may implement the chart to determine the layout of the room 1102, as indicated at step 1338.

Figure 13D:
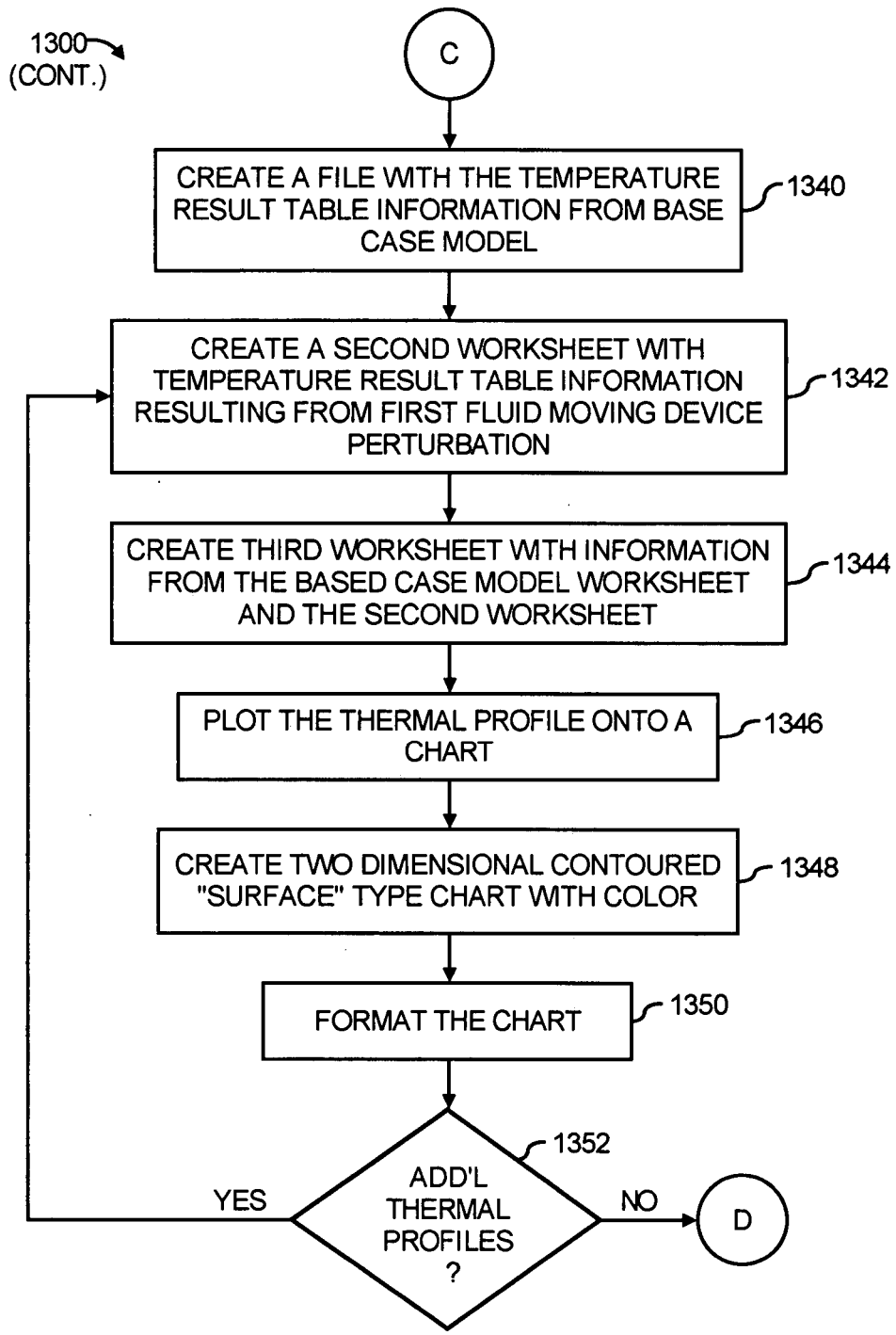

With reference now to FIG. 13D, there are shown steps for determining the thermal profile in the room 1102 (step 1008) from the information obtained from the steps outlined in FIGS. 13A and 13B. More particularly, at step 1340, the computerized tool 900 may utilize the information contained in the temperature results tables stored at step 1306 (FIG. 13A) from the base case model determined at step 1302 (FIG. 13A) and at the various heights (step 1310) to create a file, such as a spreadsheet file with the temperature information. According to an example, the data extraction module 904 may communicate with a spreadsheet program, such as, MS EXCEL, available from Microsoft Corporation of Redmond, Seattle. In this example, the data extraction module 904 may store the temperature result table information in the spreadsheet program.

At step 1342, a second worksheet containing information from the temperature result table stored at step 1316 (FIG. 5B) and at the various heights (step 1320) resulting from a first fluid moving device 304a perturbation at step 1312 (FIG. 5A) may be created. The second worksheet may be saved with a name that distinguishes the worksheet from other worksheets, for instance, the worksheet name may be derived from the first perturbed fluid moving device 304a.

At step 1344, a third worksheet may be created and information from the worksheet containing the temperature information from the base case model and information from the second worksheet may be inserted into the third worksheet. The third worksheet may include, for instance, the temperature information from the base case model in one column, the temperature information from the second worksheet in another column, the difference in temperature between the base case model and the modified temperature at step 1312 in a third column, and a thermal profile calculation based upon the information contained in the first three columns in a fourth column.

Thus, for instance, the fourth column in the third worksheet may include a TCI calculation (Equation (2)) for the first fluid moving device 504a. More particularly, for each row in the third column, the temperature information from the second column may be subtracted from the temperature information from the first column, and the difference may be divided by the difference in temperature between the base case model and the temperature set for the first moving device 504a at step 1312 in the third column. A fifth column may include information, for instance, in a two or three dimensional coordinate system, of the locations at which the temperatures were modeled.

At step 1346, the computerized tool 900 or the spreadsheet program may plot the thermal profile information from the fourth column and the fifth column onto a chart to thereby depict the TCI information for various areas in the room 1102. In situations where the spreadsheet program is implemented, the computerized tool 900 may select the thermal profile information contained in the spreadsheet and may invoke or otherwise activate a chart creating program, such as a chart wizard, to create the chart.

According to an example, the chart may comprise a "surface" type of chart having a two dimensional contour and having color, as indicated at step 1348. At step 1350, the chart may be formatted to, for instance, remove tick marks and a legend box on the chart to therefore obtain the thermal profile 1110a depicted in FIG. 11A, without the room 1102 layout.

In addition, or alternatively, the third worksheet may include additional information with respect to the temperatures obtained in FIGS. 13A-13C. The additional information may include the temperatures at various inlets and outlets of the racks 1106a-e at various fluid moving device 304a-304f temperatures. In this regard, one column in the third worksheet may include the inlet temperatures, a second column may include the outlet temperatures, and a third column may include the temperatures of the fluid supplied by the fluid supply devices 1104a-n, which may be considered as reference temperatures. In this example, a fourth column may include a SHI calculation (Equation (6)) for various locations in the room 1102. More particularly, for each row of the third worksheet, the fourth column may include an equation to calculate the SHI information in the room. A fifth column may include information, for instance, in a two or three dimensional coordinate system, of the locations at which the inlet, outlet, and reference temperatures were modeled. In addition, steps 1346-1350 may be performed to chart the SHI values in the room 1102 as depicted in FIG. 3.

In any case, at step 1352, a determination as to whether thermal profiles for additional fluid moving devices 1104b-1104f are to be charted may be made. An election to chart thermal profiles for additional fluid moving devices 1104b-f may be made, for instance, if it is determined that the thermal profiles associated with each of the fluid moving devices 1104b-f have not been previously charted. In response to a "yes" condition at step 1352, steps 1342-1352 may be respectively repeated for the remaining fluid moving devices 1104b-f to thereby chart the thermal profiles 1110a-1110n of the fluid moving devices 1104b-f. In addition, the thermal profiles 1110a-1110n of the fluid moving devices 1104a-f may be stored as respective worksheets.

Figure 13E:
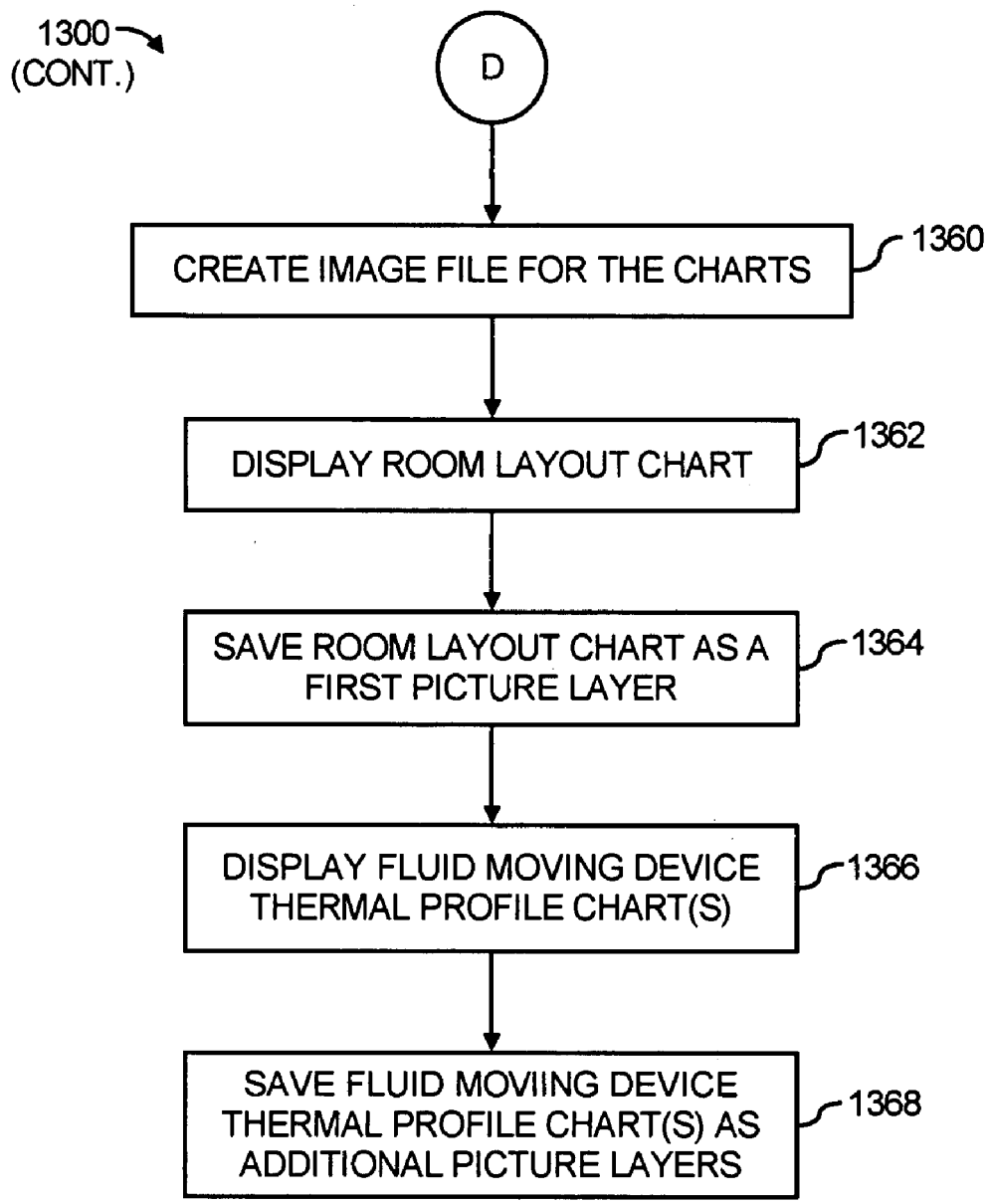

In response to a "no" condition at step 1352, the computerized tool 900 may create an editable image file with the charts created in FIGS. 13A-13C, as indicated at step 1360 (FIG. 13E). More particularly, for instance, the computerized tool 900 may import or export the charts into a file where the charts may be manipulated. According to an example, the computerized tool 900 may export the charts into an image editing program, such as, ADOBE PHOTOSHOP, available from Adobe Systems Incorporated of San Jose, Calif.

In any regard, at step 1362, the computerized tool 900 or the image editing program may display the chart depicting the room layout created at steps 1332-1338. The room layout chart may be manipulated in various respects to refine the display of the room layout. The room layout chart may be refined to, for instance, more clearly delineate the locations of the fluid moving devices 1104a-f and the racks 1106a-e from the remaining areas of the room 1102. The room layout chart may also be refined by including labels for each of the components depicted in the room layout 1102. In addition, the refined room layout may be saved as a first picture layer as indicated at step 1364.

At step 1366, the chart depicting the thermal profile of a first fluid moving device 304a created at steps 1340-1350 may be displayed over the first picture layer including the room layout as a second picture layer. The thermal profile depicted in the second picture layer may be refined at step 1366 or during the plotting of the thermal profile to depict thermal profiles that exceed a predetermined minimum value. In this regard, extraneous thermal profile values may be omitted from the display.

The overlay of the second picture layer on the first picture layer may result in an image similar to the combined layout 1100 depicted in FIG. 11A or the combined layout 1200 depicted in FIG. 12 depending on the thermal profile being displayed. In addition, at step 1366, the chart depicting the thermal profile of a second fluid moving device 304*b* created at steps 1340-1350 may also be displayed over the first and/or second picture layers as a third picture layer. The overlay of the third picture layer may result in an image similar to the combined layout 1100' depicted in FIG. 11B. The charts depicting the thermal profiles of the remaining fluid moving devices 1104*c-f* may also be respectively overlaid as additional picture layers to thereby enable the thermal profiles of the fluid moving devices 1104*a-f* to be displayed individually or in combination with each other.

At step 1368, the thermal profile charts of the fluid moving devices 1104*a-f* may be stored as additional picture layers. As such, users may access the thermal profile charts to determine, for instance, the areas of influence for each of the fluid moving devices 1104*a-f* and may also manipulate the data as desired.

The picture layers containing the room layout 1102 and the thermal profiles 1110*a*-1110*n* of the fluid moving devices 1104*a-n* may be stored according to the heights at which the thermal profiles 1110*a*-1110*n* were determined. As such, for instance, a number of files pertaining to thermal profiles 1110*a*-1110*n* determined at the various heights may be created and stored to thereby enable analysis and visualization of thermal profiles 1110*a*-1110*n* at different heights in the room 1102.

According to another example, a three-dimensional layout of the room 1102 and thermal profiles 1110*a*-1110*n* associated with the fluid moving devices 1104*a-n* may be created. In this example, the environmental condition result tables for a number of room height locations may be retrieved and/or stored at step 1304. The information contained in the environmental condition result tables at the various heights may be plotted together at step 1332 to create a three-dimensional layout of the room 1102. In addition, at step 1334, a three dimensional chart may be created. The thermal profiles of the fluid moving devices 1104*a-n* may also be plotted in three dimensions at step 1346 and a three-dimensional chart may be created at step 1348.

Figure 14:
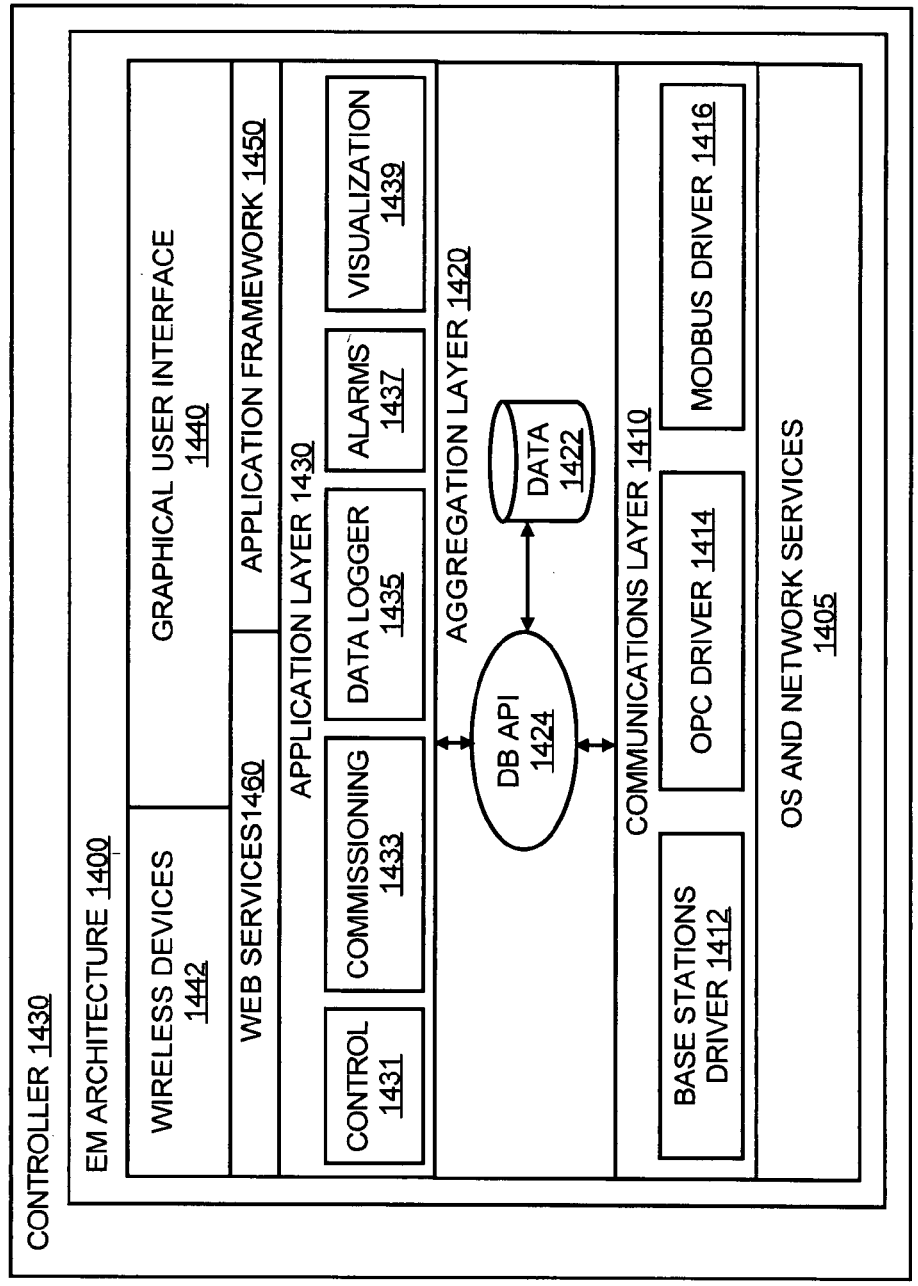
FIG. 14 illustrates a block diagram of a controller as an application server operable with software therein to implement an EM architecture for a data center, according to an embodiment of the invention.

In one embodiment, the controller 1430 may be a computing device such as a computer system or an application server operable with software therein to implement the EM architecture for environmental management of the data center 100. FIG. 14 illustrates a block diagram of the controller 1430 as an application server operable with software therein to implement an EM architecture 1400 for the data center 100, in accordance with one embodiment. The EM architecture 1400 includes at least the following layers or modules: a communication layer 1410, an aggregation layer 1420, an application layer 1430, and a graphical user interface (GUI) layer 1440 to allow the interaction of the actuators (114*a-n*), the distributed sensor network (120*a-n*) and system administrators or users of the data center 100. These layers reside or operate on top of the operating system (OS) and network services 1405 in a manner understood in the art. Each of the layers or modules 1410-1440 are further described below.

Communication Layer

Referring to FIG. 14, the communication layer 1410 is operable to provide data exchange between the EM architecture 1400 and the distributed sensor network and actuators in the data center 100. Thus, it is operable to read monitoring information from the distributed sensor network and forward such information to the aggregation layer 1420. The communication layer 1410 also relays information from the aggregation layer 1420 back to the actuators in the data center 100. The exchange of messages is achieved by one or more communication drivers in the communication layer 310 that listen or connect to each sensor or actuator device and translates its data for other components in the EM architecture 1400 to use.

In one embodiment, the communication layer 1410 includes a base station driver 1412 that enables communication with the distributed sensor network and the sensors 120*a-n* therein. The data gathered by the driver 1412 is then made accessible to the rest of the EM architecture's components by storing it in a database, e.g., the database 1422, in the aggregation layer 1420. As referred herein, the base stations are autonomous sensor boxes, each containing the inlet temperature sensors of a rack. Thus, each base station transmits information from a group of sensors of each rack. In one embodiment, the base stations use multicasting to send out the temperature information of sensors therein to the EM architecture 1400. Thus, the base station driver 1412 connects to the multicast group and listens to the temperature updates from all base stations in the data center 100.

In another embodiment, the communication layer 1410 includes an object-linking-and-embedding-for-process-control (OPC) driver 1414 that enables communication with field devices, such as the sensors 120*a-n* in the distributed sensor network and the actuators 114 and 224 in the data center 100. The OPC driver provides communication via a server-client configuration connected through a communication port, such as the Ethernet. The OPC driver 1412 may be implemented in the communication layer 1410 to take advantage of any available building management or automation system (BAS) for the data center 100 that provides OPC server capabilities. As understood in the art, a BAS enables the administration, operations, and performance of environmental-control equipment (e.g., heating, ventilating and air-conditioning or HVAC units, CRAC units) an alarm systems through purpose-built networks and protocols.

As also understood in the art, an OPC server in the BAS is operable to provide an OPC interface to allow any client to access its devices, regardless of the manufacturer(s) of such devices. One side of the OPC server is the proprietary side of the hardware providers with their specific logic or protocol to communicate with their proprietary devices. The other side of the OPC server is the application side of the software developers, whereby one or more standardized OPC interfaces are provided for the software developers to access the proprietary devices through the specific logic or protocol without the need to fully understand the make-up of such specific logic. Accordingly, the OPC driver 1414 is operable to connect to the OPC server of an existing BAS for the data center 100 and allows the EM architecture 1400 to control and configure all BAS devices, e.g., the actuators and sensors in the data center 100, whose settings are available via the OPC server. In one embodiment, the OPC driver 1414 implements the client and connects over TCP/IP to the OPC server to get and set information on the actuators and sensors.

In still another embodiment, the communication layer 1410 includes a Modbus driver 1416 for direct communication with the sensors, actuators, or both in the data center 100 rather than through an OPC server. As understood in the art, Modbus is a widely used communication protocol for automation and control. Thus, instead of installing an expensive OPC server that otherwise may not be available through a BAS, a low cost Modbus connection may suffice.

Accordingly, communication drivers with different communication protocols may be used in the communication layer 1410 to enable communication between the EM architecture 1400 and the actuators and sensors in the data center 100, so long as the chosen communication drivers are operable to communicate with the actuators and sensors with suitable communication protocol(s) to provide data exchange with other components in the EM architecture 1400.

Aggregation Layer

Referring back to the EM architecture 1400 in FIG. 14, the aggregation layer 1420 therein serves as a repository for the configuration parameters of the EM architecture 1400, its current state, and the history of previous sensor network data (as gathered from the distributed sensor network in the data center 100) and actuator set points (as determined by the commissioning of sensors discussed earlier). All data generated from or used by applications and hardware (sensors and actuators) resides here in the form of a database 1422. Both the application layer 1430 and the communication layer 1410 access each other and the aggregation layer 1420 through a common database Application Programming Interface (API) 1424. Thus, changing from one particular database solution to another in the aggregation layer 1420 does not impact the other layers of the EM architecture 1400, only the database API 1424. Furthermore, usage of the aggregation layer 1420 separates the data storage functionality from the application layer 1430 and the communication layer 1410. This gives the EM architecture 1400 a degree of modularity that allows continuous communication even if an application in the application layer 1430 stops, or vice versa. Moreover, depending on the desired engine for the database 1422, the data held in the database 1422 of the aggregation layer 1420 may be replicated (either active/passive or active/active for both the original and newly-replicated databases) without modifying the other layers in the EM architecture 1400.

Application Layer

The application layer 1430 of the EM architecture 1400 includes software-implemented application modules responsible for control (1431), commissioning (1433), visualization (1435), data logger and layout monitoring (1437), alarms and notifications (1439), and any other configuration parameters. All application modules in the application layer 1430 interact with the aggregation layer 1420 through the database API 1424. Each of the aforementioned application modules 1431-1439 is described below.

In the absence of an explicit plant function of the data center 100 for dynamic environmental control thereof, there is a desire to determine a relationship or correlation between the actuators and sensors in the data center 100 that may be used in the dynamic control. This correlation is determined by the commissioning module 1433, which performs the commissioning process as described earlier with reference to FIGS. 3-6 and as disclosed in the aforementioned U.S. Patent Application Publication No. 20060206291, entitled "COMMISIONING OF SENSORS." The output of the commissioning module 1433 is then fed to the control module 1431, which provides control of the actuators 114*a-n* based on the commissioning of the sensors, as described earlier with reference to FIGS. 7-8 and as disclosed in the aforementioned U.S. Patent Publication No. 20060214014, entitled "TEMPERATURE CONTROL USING A SENSOR NETWORK." Thus, the initial multi-input (sensors), multi-output (actuator setpoints) control problem for the EM architecture 1400 is simplified to a series of single-input (actuator error signals), dual-output (temperature setpoint and airflow) controllers.

The application layer 1430 also includes a data logger module 1435, which provides storage and visualization of historical data. Data collected from the distributed sensor network and actuators in the data center 100 is logged onto the database 1422 by the data logger module 1435. The historical data collected may then be used evaluate system's performance, and detect cooling problems or other inefficiencies.

The data logger module 1435 also provides a GUI, which may be separate from or a part of the GUI 340, to allow the user to create plots and view trends.

The visualization module 1439 implements the visualization tool 900 as described earlier with reference to FIGS. 9-13 and as disclosed in the aforementioned U.S. patent application Ser. No. 11/699,402, entitled "COMPUTERIZED TOOL FOR ASSESSIGN CONDITIONS IN A ROOM." As described earlier, the visualization tool 900 is operable to portray data overlaid on the computer room's floor plan and provide visual representations of equipment, such as racks and CRACs, in the data center 100 to show sensor information using colors. It is also operable to show or provide a display of data-center information such as configuration parameters, controller error, TCI values, or alarm conditions. Thus, the visualization module 1439 allows user inputs of equipment locations or uploads of images, e.g., raster images, of the data center 100 (as described earlier with reference to FIGS. 9-10). In one embodiment, the visualization module 1439, through its implemented visualization tool 900, allows users has entered equipment locations by dragging and dropping equipment icons on the floor plan image, from which current temperatures or values derived from the sensed data may be visualized according to their physical locations. Through this visualization, users are able to instantiate any environmental management or control schemes being applied to the data center 100.

The alarms and notifications module 1437 is operable to monitor a set of system pre-defined or user-defined conditions. If conditions are found to be true, it logs the event, and notifies users or other monitoring devices, such as the data logger 1435 and the database 1432 in the aggregation layer 1420 used for storing system states and configuration parameters.

Other application modules may be added to the application layer 1430, as new functionalities are defined or desired by the users to be included in the EM architecture 1430. For example, usage of pressure sensors in the distributed sensor network of the data center 100 allow applications such as real-time computational fluid dynamics (CFD) analysis to run in the application layer 1430.

Graphical User Interface (GUI) Layer

The GUI layer 1440 is operable to provide visual feedback to the data center users through its implementation of the visualization module 1439 in the application layer 1430. An example of a GUI provided by the GUI layer 1440 is a web browser. Any authorized user with the right credentials may access the GUI 1440 for viewing or performing administration related tasks. The GUI layer 1440 may further include a simplified or "stripped-down" version of a regular GUI, such as the wireless version, to enable access to the EM architecture 1400 by devices with less graphic capability, such as cell phones, personal digital assistants (PDAs), and other mobile devices. Thus, the GUI layer 1440 allows user-viewing of information gathered by the EM architecture 1400. It controls and configures the other layers in the EM architecture 1400, particularly the visualization module 1439 and the visualization tool 900 therein. The GUI layer 1440 employs the application framework 1450, the web services 1452, or both to access the applications in the application layer 1430 and data stored in the aggregation layer 1420. The application framework 1450 and web services 1452 may be dependent on the OS and implementation infrastructure.

The EM architecture 1400 may be implemented as a utility, program, or subprogram, in any desired computer readable medium. For example, the EM architecture 1400 may be implemented using the .NET framework, with a web browser as the GUI. The communication layer 1410 may be written in Visual Basic .NET to access an OPC server to connect to the distributed sensor network, the actuators, or both in the data center 100. It also listens to the distributed sensor network for multicast packets sent by the sensors. The aggregation layer 1420 may include a MSSQL server, with a SQL OBDC driver serving as the API 1424. This driver handles all transactions between the application modules in the application layer 1430 and the database 1422. The application modules may be written in C# which also conforms to the .NET framework.

Figure 15:
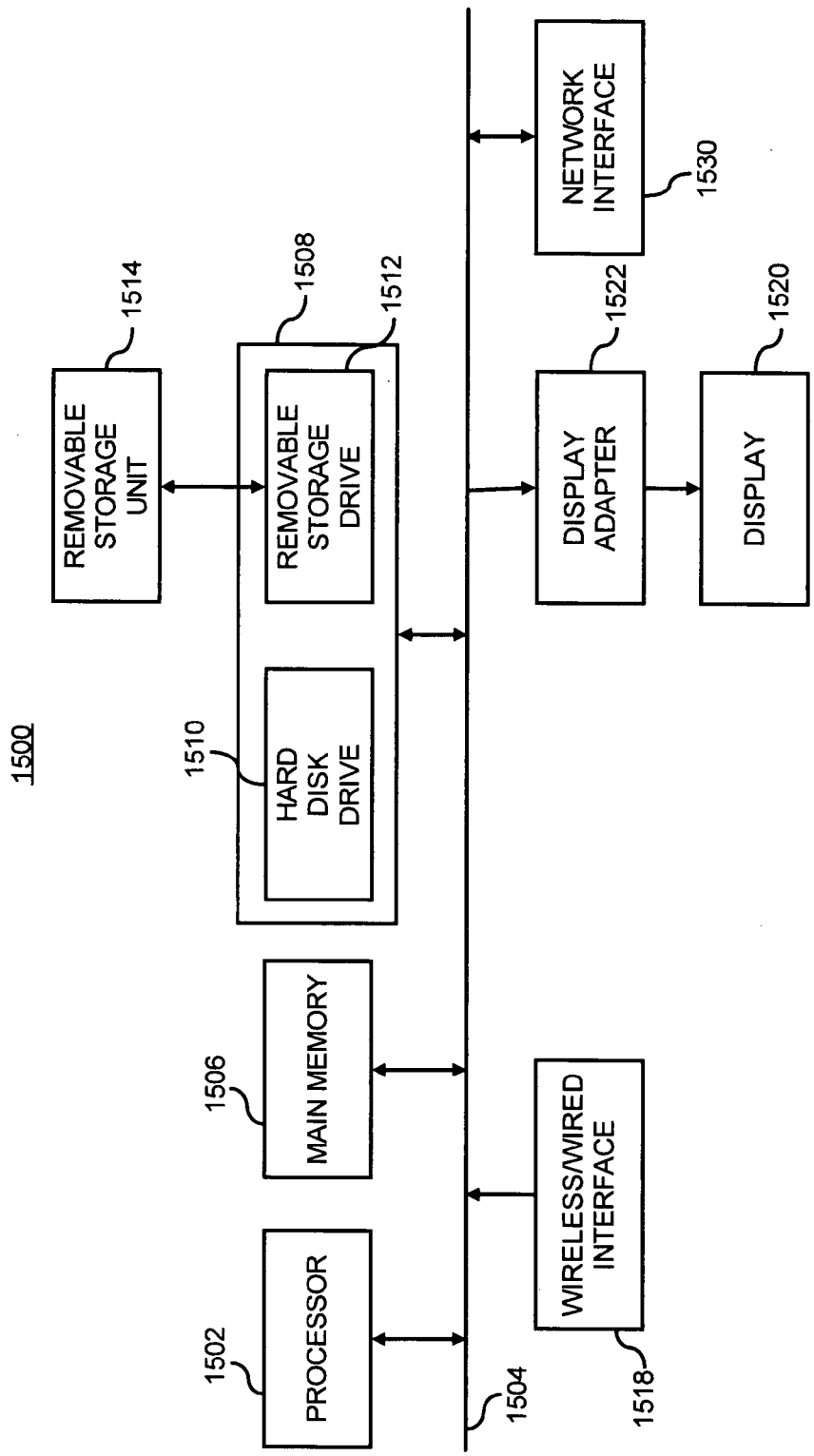
FIG. 15 illustrates a computer system, which may be employed to perform the various functions of the controller in FIG. 1.

FIG. 15 illustrates a block diagram of a computerized system 1500 that is operable to be used as a platform for implementing the controller 130 (FIG. 1), the EM architecture 1400 (FIG. 14) therein, or both.

The computer system 1500 includes one or more processors, such as processor 1502, providing an execution platform for executing software. Thus, the computerized system 1500 includes one or more single-core or multi-core processors of any of a number of computer processors, such as processors from Intel, AMD, and Cyrix. As referred herein, a computer processor may be a general-purpose processor, such as a central processing unit (CPU) or any other multi-purpose processor or microprocessor. A computer processor also may be a special-purpose processor, such as a graphics processing unit (GPU), an audio processor, a digital signal processor, or another processor dedicated for one or more processing purposes. Commands and data from the processor 1502 are communicated over a communication bus 1504 or through point-to-point links with other components in the computer system 1500.

The computer system 1500 also includes a main memory 1506 where software is resident during runtime, and a secondary memory 1508. The secondary memory 1508 may also be a computer-readable medium (CRM) that may be used to store software programs, applications, or modules for the EM architecture 1400 (including, e.g., the PI or PID controller in the controller 130 as mentioned earlier). The main memory 1506 and secondary memory 1508 (and an optional removable storage unit 1514) each includes, for example, a hard disk drive and/or a removable storage drive 1512 representing a floppy diskette drive, a magnetic tape drive, a compact disk drive, etc., or a nonvolatile memory where a copy of the software is stored. In one example, the secondary memory 408 also includes ROM (read only memory), EPROM (erasable, programmable ROM), EEPROM (electrically erasable, programmable ROM), or any other electronic, optical, magnetic, or other storage or transmission device capable of providing a processor or processing unit with computer-readable instructions. The computer system 1500 includes a display 1520 connected via a display adapter 1522, user interfaces comprising one or more input devices 1518, such as a keyboard, a mouse, a stylus, and the like. The display 1520 may constitute the GUI layer 1440 or be a part of such a GUI layer. A network interface 1530 is provided for communicating with other computer systems via, for example, a network. The network interface 1530 may be accessible by the network services 1405 in the EM architecture 1400.

What has been described and illustrated herein is an embodiment along with some of its variations. The terms, descriptions and figures used herein are set forth by way of illustration only and are not meant as limitations. Those skilled in the art will recognize that many variations are possible within the spirit and scope of the subject matter, which is intended to be defined by the following claims—and their equivalents—in which all terms are meant in their broadest reasonable sense unless otherwise indicated.

What is claimed is:

1. A computer readable storage medium on which is embedded one or more computer programs, said one or more computer programs being configured as an environmental management architecture for providing environmental management of a physical location using a sensor network having a plurality of environmental sensors and at least one primary actuator configured to provide an environmental change to the physical location, the one or more computer programs comprising:
   a communications module that operates to access the plurality of environmental sensors of the sensor network; and
   an application module that operates to:
   a) commission the plurality of environmental sensors of the sensor network and receive detected conditions from the plurality of environmental sensors;
   b) control an operation of the at least one primary actuator to provide environmental management of the physical location based on the commission and detected conditions of the plurality of environmental sensors of the sensor network; and
   c) provide a graphical layout of an environmental condition of the physical location based on the commissioning and detected conditions of the plurality of environmental sensors and the control of the at least one primary actuator, wherein the graphical layout graphically depicts a mapping of at least one of the detected conditions and values derived from the detected conditions with respect to objects contained in the physical location;
   wherein the environmental management architecture at least one of resides and operates on top of an operating system of a computing device and network services on which the computing device is connected.

2. The computer readable storage medium of claim 1, said one or more computer programs further comprising:
   an aggregation module that stores data generated by the sensor network and the application module.

3. The computer readable storage medium of claim 2, wherein the application module includes:
   a data logger sub-module that operates to log the data generated by the sensor network and the application module in the aggregation module for storage.

4. The computer readable storage medium of claim 1, said one or more computer programs further comprising:
   an aggregation module that operates to provide an interface for data exchange between the communications module and the application module.

5. The computer readable storage medium of claim 1, wherein the communications module includes at least one of:
   a communication driver that implements an object-linking-and-embedding-for-process-control (OPC) client to gain access to the plurality of sensors of the sensor network;
   a communication driver that operates to receive multicasts as transmitted from the plurality of environmental sensors of the sensor network; and
   a communication driver that operates to directly communicate with each of the plurality of environment sensors of the sensor network.

6. The computer readable storage medium of claim 1, wherein the plurality of environmental sensors of the sensor network are temperature sensors arranged throughout the physical location.

7. The computer readable storage medium of claim 1, said one or more programs further comprising:

a graphical user interface (GUI) module that operates to display the graphical layout of the environmental condition of the physical location.

8. The computer readable storage medium of claim 7, wherein the GUI module includes a capability to display a simplified version of the graphical layout on wireless devices.

9. The computer readable storage medium of claim 1, further comprising:
a graphical user interface (GUI) module that operates to receive a user input of at least one of a parameter for modifying the operational control of the at least one primary actuator, a parameter for the commission of the plurality of environmental sensors of the sensor network, and an equipment layout at the physical location.

10. The computer readable storage medium of claim 1, wherein the application module further comprises:
a notification module that operates to monitor one or more conditions of the system and to generate a notification upon the system achieving a predefined condition.

11. The computer readable storage medium of claim 1, wherein the at least one primary actuator comprises secondary actuators, the secondary actuators include a device for controlling supply airflow volume and a device for controlling supply airflow temperature.

12. A method for implementing an environmental management architecture for providing environmental management of a physical location using a sensor network having a plurality of environmental sensors and at least one primary actuator configured to provide an environmental change to the physical location, wherein the environmental management architecture at least one of resides and operates on top of an operating system of a computing device and network services on which the computing device is connected, the method comprising steps performed by a processor of the computing device of:
accessing the plurality of environmental sensors of the sensor network with at least one communication driver to receive detected sensor data;
commissioning the plurality of environmental sensors of the sensor network based on the sensor data from the accessing;
controlling an operation of the at least one primary actuator to provide environmental management of the physical location based on the commissioning; and
generating a display of a graphical layout of an environmental condition of the physical location based on the commissioning, the detected sensor data, and the controlling, wherein the graphical layout graphically depicts a mapping of at least one of the detected sensor data and values derived from the detected sensor data with respect to objects contained in the physical location.

13. The method of claim 12, further comprising:
storing data generated by the sensor network and the application module in an aggregation module.

14. The method of claim 12, further comprising:
monitoring one or more conditions of the system and to generate a notification upon the system achieving a predefined condition.

15. The method of claim 14, wherein commissioning the plurality of environmental sensors of the sensor network based on the reading of sensor data comprises:
calculating a correlation index from the read sensor data, wherein the correlation index provides a relationship between one of the plurality of environmental sensors and the at least one primary actuator; and
assigning the one environmental sensor to one of a plurality of actuator families of the at least one primary actuator.

16. The method of claim 15, wherein controlling an operation of the at least one primary actuator comprises:
selecting one of a plurality of control schemes for operating the at least one primary actuator based on the commissioning and one or more predefined criteria;
implementing the selected one of the plurality of control schemes to operate the at least one primary actuator to vary the environmental condition of the physical location.

17. The method of claim 16, wherein generating a display of a graphical layout of the environmental condition of the physical location comprises:
modeling the environmental condition of the physical location based on the sensor data received from the accessing;
extracting environmental condition data of the physical location from the modeling; and
calculating the graphical layout of the environmental condition of the physical location from the environmental condition data.

18. The method of claim 17, wherein the at least one primary actuator comprises secondary actuators, the secondary actuators include a device for controlling supply airflow volume and a device for controlling supply airflow temperature, and the plurality of control schemes include a scheme for controlling the secondary actuators.

19. A computer-readable storage medium on which is encoded programming code for an environmental management architecture for providing environmental management of a physical location using a sensor network having a plurality of environmental sensors and at least one primary actuator configured to provide an environmental change to the physical location, wherein the environmental management architecture at least one of resides and operates on top of an operating system of a computing device and network services on which the computing device is connected, said programming code including a set of instructions that when executed by a computer operates to:
access the plurality of environmental sensors of the sensor network with at least one communication driver to receive detected sensor data;
commissioning the plurality of environmental sensors of the sensor network based on the sensor data from the accessing;
control an operation of the at least one primary actuator to provide environmental management of the physical location based on the commissioning; and
generating a display of a graphical layout of an environmental condition of the physical location based on the commissioning, the detected sensor data, and the controlling, wherein the graphical layout graphically depicts a mapping of at least one of the detected sensor data and values derived from the detected sensor data with respect to objects contained in the physical location.

20. The computer-readable medium of claim 19, wherein the encoded programming code when executed by the computer further operates to:
monitor one or more conditions of the system and to generate a notification upon a system achieving a predefined condition.

* * * * *